(12) United States Patent
Jang

(10) Patent No.: US 12,218,092 B2
(45) Date of Patent: Feb. 4, 2025

(54) SEMICONDUCTOR PACKAGE AND METHOD OF MANUFACTURING SEMICONDUCTOR PACKAGE

(71) Applicant: SAMSUNG ELECTRONICS CO., LTD., Suwon-si (KR)

(72) Inventor: Moonyong Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 182 days.

(21) Appl. No.: 17/690,270

(22) Filed: Mar. 9, 2022

(65) Prior Publication Data

US 2023/0039094 A1     Feb. 9, 2023

(30) Foreign Application Priority Data

Aug. 3, 2021    (KR) ........................ 10-2021-0101795

(51) Int. Cl.
    *H01L 23/498*     (2006.01)
    *H01L 21/48*     (2006.01)
    (Continued)

(52) U.S. Cl.
    CPC .......... *H01L 24/16* (2013.01); *H01L 21/4857* (2013.01); *H01L 21/486* (2013.01);
    (Continued)

(58) Field of Classification Search
    CPC ................. H01L 21/486; H01L 23/481; H01L 23/49811; H01L 23/49822;
    (Continued)

(56) References Cited

U.S. PATENT DOCUMENTS

| | | | |
|---|---|---|---|
| 3,516,156 A * | 6/1970 | Steranko | H05K 3/4046 439/85 |
| 5,659,953 A * | 8/1997 | Crane, Jr. | H05K 1/112 29/830 |

(Continued)

FOREIGN PATENT DOCUMENTS

| | | |
|---|---|---|
| JP | 2002-76055 A | 3/2002 |
| KR | 100216844 B1 * | 9/1999 |
| KR | 10-1443889 B1 | 9/2014 |

OTHER PUBLICATIONS

Translation of Yun, KR 100216844 B1, 1999 (Year: 1999).*

*Primary Examiner* — Nicholas J Tobergte
*Assistant Examiner* — William Henry Anderson
(74) *Attorney, Agent, or Firm* — Sughrue Mion, PLLC

(57) ABSTRACT

A semiconductor package includes a package substrate, a semiconductor chip, connection pins and a molding member. The package substrate includes wiring patterns provided respectively in insulation layers, and has insertion holes extending from an upper surface of the package substrate in a thickness direction that expose portions of the wiring patterns in different insulation layers. The semiconductor chip is disposed on the package substrate, and has a first surface on which chip pads are formed. The connection pins are provided on the chip pads, respectively, and extend through corresponding ones of the insertion holes and electrically connect to the portions of the wiring patterns, respectively, that are exposed by the insertion holes. The molding member is provided on the package substrate to cover the semiconductor chip.

18 Claims, 22 Drawing Sheets

(51) Int. Cl.
*H01L 23/00* (2006.01)
*H01L 25/065* (2023.01)

(52) U.S. Cl.
CPC .. *H01L 23/49822* (2013.01); *H01L 23/49838* (2013.01); *H01L 24/13* (2013.01); *H01L 24/14* (2013.01); *H01L 24/17* (2013.01); *H01L 24/73* (2013.01); *H01L 24/81* (2013.01); *H01L 25/0657* (2013.01); H01L 23/49816 (2013.01); H01L 23/49827 (2013.01); H01L 2224/13007 (2013.01); H01L 2224/13021 (2013.01); H01L 2224/13541 (2013.01); H01L 2224/13553 (2013.01); H01L 2224/1357 (2013.01); H01L 2224/1403 (2013.01); H01L 2224/16014 (2013.01); H01L 2224/16227 (2013.01); H01L 2224/16237 (2013.01); H01L 2224/1703 (2013.01); H01L 2224/73204 (2013.01); H01L 2224/81203 (2013.01); H01L 2225/0651 (2013.01); H01L 2225/06517 (2013.01); H01L 2225/06524 (2013.01); H01L 2225/06562 (2013.01); H01L 2924/1431 (2013.01); H01L 2924/1438 (2013.01)

(58) Field of Classification Search
CPC ......... H01L 23/49827; H01L 23/49838; H01L 24/04; H01L 24/05; H01L 24/06; H01L 2224/08111; H01L 2224/08151; H01L 2224/08221; H01L 2224/08225; H01L 2224/08237; H01L 2224/0903; H01L 2224/09102; H01L 2224/09104; H01L 2224/16227; H01L 2224/16237; H01L 2225/06548; H01L 24/12; H01L 24/13; H01L 24/14; H01L 24/20; H01L 24/81; H01L 2224/08113; H01L 2224/09103; H01L 2224/1403; H01L 2224/13023; H01L 2224/1703; H01L 2225/06517; H01L 2225/06524; H01L 25/0657; H01L 23/4334; H01L 2221/68377; H01L 23/42; H01L 23/16; H01L 2224/85007; H05K 3/3473; H05K 3/244

See application file for complete search history.

(56) References Cited

U.S. PATENT DOCUMENTS

| | | | |
|---|---|---|---|
| 5,768,109 A * | 6/1998 | Gulick | H01L 23/13 257/E23.173 |
| 6,324,069 B1 * | 11/2001 | Weber | H01L 21/565 29/841 |
| 6,522,017 B2 | 2/2003 | Horiuchi et al. | |
| 6,817,870 B1 * | 11/2004 | Kwong | H05K 3/368 439/74 |
| 6,936,502 B2 * | 8/2005 | Wyrzykowska | H05K 3/303 29/835 |
| 7,005,749 B2 | 2/2006 | Hsu et al. | |
| 7,534,660 B2 | 5/2009 | Lee | |
| 7,652,374 B2 | 1/2010 | Kok et al. | |
| 9,570,423 B2 | 2/2017 | Jang et al. | |
| 2005/0263322 A1 * | 12/2005 | Mickievicz | H05K 1/112 29/840 |
| 2008/0283999 A1 | 11/2008 | Tosaya et al. | |
| 2009/0246916 A1 | 10/2009 | Tosaya et al. | |
| 2020/0243494 A1 * | 7/2020 | Lai | H01R 12/7047 |
| 2022/0077114 A1 * | 3/2022 | Park | H01L 23/16 |

* cited by examiner

SEMICONDUCTOR PACKAGE AND METHOD OF MANUFACTURING SEMICONDUCTOR PACKAGE

PRIORITY STATEMENT

This application claims priority under 35 U.S.C. § 119 to Korean Patent Application No. 10-2021-0101795, filed on Aug. 3, 2021 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including a semiconductor chip stacked in a flip chip bonding manner and a method of manufacturing the same.

2. Description of the Related Art

A semiconductor package structure using a flip chip bonding manner may have advantages of obtaining improved electrical characteristics and a relatively lower package height compared to a conventional wire bonding structure. However, due to the characteristics of the flip chip bonding process, tilting of a semiconductor chip may occur, and in case of a package product having a dolmen structure, a molding member material may get into a space between the semiconductor chip and an upper semiconductor chip due to tilting of the semiconductor chip.

SUMMARY

It is an aspect to provide a semiconductor package having structural stability and improved electrical properties.

It is another aspects to provide a method of manufacturing the semiconductor package.

According to an aspect of one or more example embodiments, a semiconductor package may include a package substrate including wiring patterns provided respectively in a plurality of insulation layers, the package substrate having insertion holes extending from an upper surface of the package substrate in a thickness direction of the package substrate to expose portions of the wiring patterns in different insulation layers; a semiconductor chip disposed on the package substrate, the semiconductor chip having a first surface on which chip pads are formed; a plurality of connection pins provided on the chip pads, respectively, the plurality of connection pins extending through corresponding ones of the insertion holes and electrically connecting to the portions of the wiring patterns, respectively, that are exposed by the insertion holes; and a molding member provided on the package substrate to cover the semiconductor chip.

According to another aspect of one or more example embodiments, a semiconductor package may include a package substrate including a first wiring pattern, a second wiring pattern, and a third wiring pattern sequentially stacked from an upper surface of the package substrate, the package substrate having a first insertion hole, a second insertion hole, and a third insertion hole extending from the upper surface of the package substrate into the package substrate to expose portions of the first wiring pattern, the second wiring pattern, and the third wiring pattern in different insulation layers, respectively; a semiconductor chip disposed on the package substrate and having a first surface on which chip pads are formed; a plurality of connection pins provided on the chip pads, respectively, the plurality of connection pins including a first connection pin, a second connection pin, and a third connection pin extending through the first insertion hole, the second insertion hole, and the third insertion hole to electrically connect to the portions of the first wiring pattern, the second wiring pattern, and the third wiring pattern that are exposed by the first insertion hole, the second insertion hole, and the third insertion hole, respectively; and a molding member provided on the package substrate to cover the semiconductor chip, wherein each of the first insertion hole, the second insertion hole, and the third insertion hole has a first diameter within a range of about 15 nm to about 150 nm, and each of the first connection pin, the second connection pin and the third connection pin has a second diameter within a range of about 5 nm to about 95 nm, the first diameter being greater than the second diameter.

According to yet another aspect of one or more example embodiments, a semiconductor package may include a package substrate; a first semiconductor chip disposed on the package substrate, the first semiconductor chip having a first surface on which chip pads are formed; a plurality of connection pins provided on the chip pads of the first semiconductor chip, respectively; at least one support structure on an upper surface of the package substrate, the at least one support structure being spaced from the first semiconductor chip; a plurality of additional semiconductor chips stacked on the package substrate and supported by the at least one support structure; and a molding member provided on the upper surface of the package substrate to cover the first semiconductor chip, the at least one support structure and the plurality of additional semiconductor chips, wherein the package substrate includes wiring patterns provided respectively in a plurality of insulation layers and the package substrate has insertion holes extending from the upper surface of the package substrate into the package substrate to expose portions of the wiring patterns in different insulation layers, respectively, and wherein the plurality of connection pins extend through corresponding ones of the insertion holes to electrically connect to the portions of the wiring patterns, respectively, that are exposed by the insertion holes.

According to yet another aspect of one or more example embodiments, a semiconductor package may include a package substrate having insertion holes extending from an upper surface of the package substrate into the package substrate to expose portions of wiring patterns in different insulation layers in the package substrate respectively, a semiconductor chip arranged on the package substrate and having a first surface on which chip pads are formed, and a plurality of connection pins provided on the chip pads and extending through the insertion holes to electrically connect to the portions of the wiring patterns, respectively, that are exposed.

BRIEF DESCRIPTION OF THE DRAWINGS

Example embodiments will be more clearly understood from the following detailed description taken in conjunction with the accompanying drawings, in which.

DETAILED DESCRIPTION

According to various example embodiments, a semiconductor chip may be mounted on a package substrate by connection pins that are inserted into insertion holes formed in the package substrate without using connection members such as bumps.

Thus, since the connection pins are inserted into the insertion holes, an overall package thickness may be reduced. Further, since chip pads of the semiconductor chip are directly connected to internal wirings of the package substrate by the connection pins, a routing space may be reduced and electrical characteristics may be improved.

FIGS. 1 to 26 represent non-limiting, example embodiments as described herein. Hereinafter, various example embodiments will be explained in detail with reference to the accompanying drawings.

Figure 1:
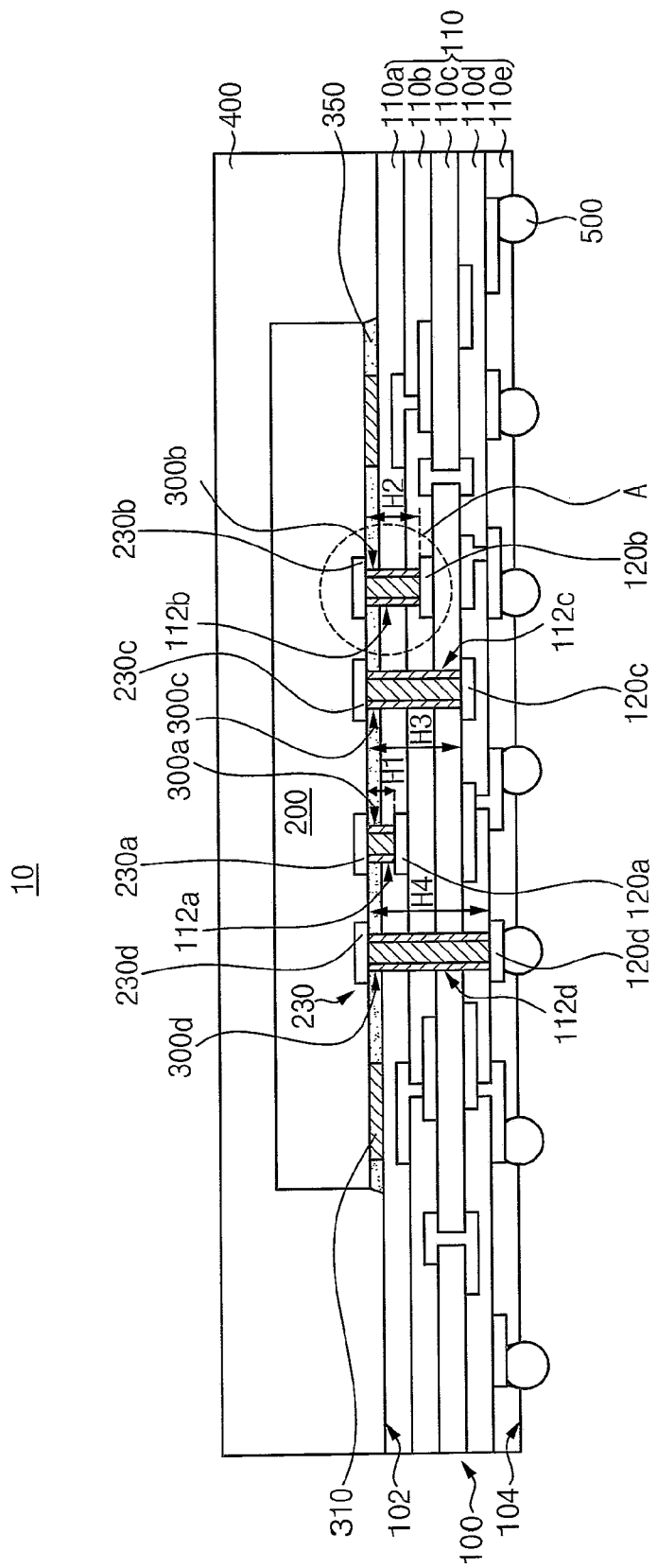
FIG. 1 is a cross-sectional view illustrating a semiconductor package in accordance with example embodiments.
Figure 2:
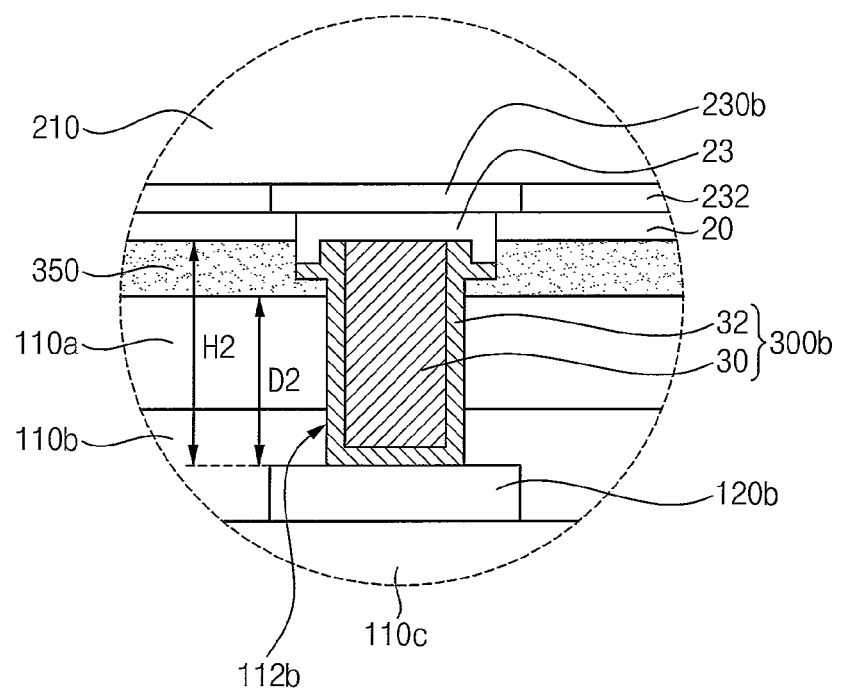
FIG. 2 is an enlarged cross-sectional view illustrating a portion 'A' of the semiconductor package of FIG. 1.
Figure 3:
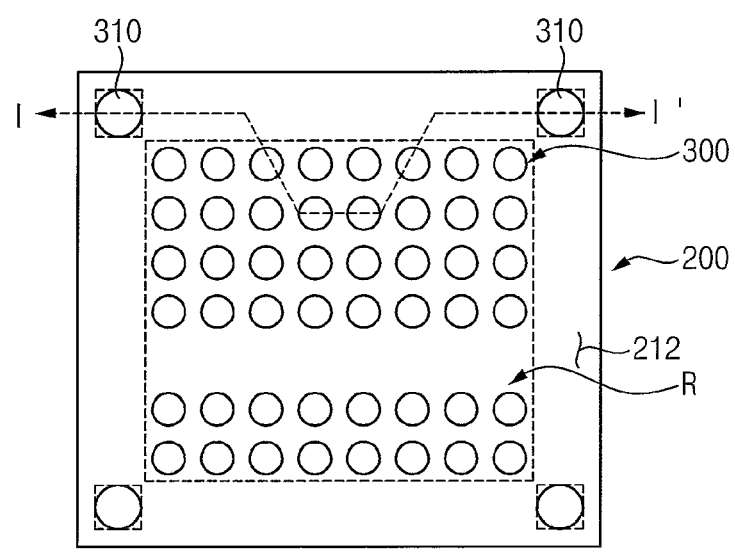
FIG. 3 is a plan view illustrating the semiconductor package in FIG. 1.

FIG. 1 is a cross-sectional view illustrating a semiconductor package in accordance with example embodiments. FIG. 2 is an enlarged cross-sectional view illustrating a portion 'A' in FIG. 1. FIG. 3 is a plan view illustrating the semiconductor package in FIG. 1. FIG. 1 is a cross-sectional view taken along the line I-I in FIG. 3.

Referring to FIGS. 1 to 3, a semiconductor package 10 may include a package substrate 100, a semiconductor chip 200, a plurality of connection pins 300 and a molding member 400. Additionally, in some example embodiments, the semiconductor package 10 may further include external connection members 500.

In example embodiments, the package substrate 100 may be a multilayer circuit board having an upper surface 102 and a lower surface 104 facing each other. For example, the package substrate 100 may be a printed circuit board (PCB) including wirings respectively provided in a plurality of layers and vias connected to the wirings.

In particular, the package substrate 100 may include a plurality of stacked insulation layers 110 and wiring patterns 120 provided respectively in the insulation layers.

The package substrate 100 may include a first insulation layer 110a, a second insulation layer 110b, a third insulation layer 110c, a fourth insulation layer 110d, and a fifth insulation layer 110e sequentially stacked on one another. The first insulation layer 110a may be an upper cover insulation layer, the second insulation layer 110b may be an upper insulation layer, the third insulation layer 110c may be a core layer, the fourth insulation layer 110d may be a lower insulation layer, and the fifth insulation layer 110e may be a lower cover insulation layer.

For example, the insulation layer 110 may include an insulating material having a thermosetting resin such as epoxy resin or a thermoplastic resin such as polyimide. The insulation layer may include a resin impregnated in a core material such as organic fiber (glass fiber), for example, a prepreg, FR-4, BT (Bismaleimide Triazine), etc.

The wiring patterns 120 may include a first wiring pattern 120a, a second wiring pattern 120b, a third wiring pattern 120c, and a fourth wiring pattern 120d. The first wiring pattern 120a may be formed on an upper surface of the second insulation layer 110b, and the second wiring pattern 120b may be formed on an upper surface of the third insulation layer 110c. The third wiring pattern 120c may be formed on a lower surface of the third insulation layer 110c, and the fourth wiring pattern 120d may be formed on a lower surface of the fourth insulation layer 110d. For example, the wiring pattern 120 may include a metal material such as copper, aluminum, etc. It will be understood that arrangements and numbers of the insulation layers and the wiring patterns are exemplary, and are not limited to the arrangement and numbers of insulation layers and wiring patterns illustrated and described.

The package substrate 100 may include a plurality of insertion holes 112 having different depths and extending from the upper surface 102. For example, the insertion holes 112 may have a diameter within a range of about 15 μm to about 150 μm. The insertion holes 112 may extend from the upper surface 102 toward the lower surface 104.

The plurality of insertion holes 112 may include a first insertion hole 112a, a second insertion hole 112b, a third insertion hole 112c, and a fourth insertion hole 112d. The first insertion hole 112a may extend through the first insulation layer 110a from the upper surface 102 in a thickness direction to expose a portion of the first wiring pattern 120a. The first insertion hole 112a may have a first depth D1 (see, e.g., FIG. 15) from the upper surface 102 to expose a portion of a first circuit layer. The portion of the first wiring pattern 120a exposed by the first insertion hole 112a may serve as a first connection pad to which a first connection pin 300a is connected.

The second insertion hole 112b may be formed to extend through the first and second insulation layers 110a and 110b from the upper surface 102 in the thickness direction to expose a portion of the second wiring pattern 120b. The second insertion hole 112b may have a second depth D2 (see, e.g., FIG. 15) from the upper surface 102 greater than the first depth D1 to expose a portion of a second circuit layer. The portion of the second wiring pattern 120b exposed by the second insertion hole 112b may serve as a second connection pad to which a second connection pin 300b is connected.

The third insertion hole 112c may be formed to extend through the first, second and third insulation layers 110a, 110b and 110c from the upper surface 102 in the thickness direction to expose a portion of the third wiring pattern 120c. The third insertion hole 112c may have a third depth D3 (see, e.g., FIG. 15) from the upper surface 102 greater than the second depth D2 to expose a portion of a third circuit layer. The portion of the third wiring pattern 120c exposed by the third insertion hole 112c may serve as a third connection pad to which a third connection pin 300c is connected.

The fourth insertion hole 112d may be formed to extend through the first, second, third and fourth insulation layers 110a, 110b, 110c and 110d from the upper surface 102 in the thickness direction to expose a portion of the fourth wiring pattern 120d. The fourth insertion hole 112d may have a fourth depth D4 (see, e.g., FIG. 15) from the upper surface 102 greater than the third depth D3 to expose a portion of a fourth circuit layer. The portion of the fourth wiring pattern 120d exposed by the fourth insertion hole 112d may serve as a fourth connection pad to which the fourth connection pin 300d is connected.

The semiconductor chip 200 may be disposed on the package substrate 100. The semiconductor chip 200 may be mounted on the package substrate 100 through the connection pins 300. A planar area of the semiconductor chip 200 may be smaller than a planar area of the package substrate 100. When viewed from a plan view, the semiconductor chip 200 may be disposed within the planar area of the package substrate 100.

The semiconductor chip 200 may include a plurality of chip pads 230 provided on a first surface 212 of the semiconductor chip 200. The connection pins 300 having different heights may be provided on the plurality of chip pads 230. Each of the connection pins 300 may have a diameter within a range of about 5 μm to about 95 μm.

A first connection pin 300a having a first height H1 may be formed on a first chip pad 230a of the plurality of chip pads. A second connection pin 300b having a second height H2 may be formed on a second chip pad 230b. The second height H2 may be greater than the first height H1. A third connection pin 300c having a third height H3 may be formed on a third chip pad 230c. The third height H3 may be greater than the second height H2. A fourth connection pin 300d having a fourth height H4 may be formed on a fourth chip pad 230d. The fourth height H4 may be greater than the third height H3. For example, the first to fourth heights may be within a range of about 15 μm to about 300 μm. A difference between the respective heights, for example, a difference between the second height and the first height may be within a range of about 15 μm to about 180 μm.

In example embodiments, the semiconductor chip 200 may be mounted on the package substrate 100 in a flip chip bonding manner. In this case, the semiconductor chip 200 may be mounted on the package substrate 100 such that an active surface on which the chip pads 230 are formed, that is, the first surface 212 faces the package substrate 100. An underfill member 350 may be provided between the first surface 212 of the semiconductor chip 200 and the upper surface 102 of the package substrate 100.

When the semiconductor chip 200 is disposed on the package substrate 100, the connection pins 300 on the chip pads 230 may be inserted into the insertion holes formed in the package substrate 100, and may be bonded to the portions of the wiring patterns exposed by the insertion holes by a thermo-compression process. The connection pins 300 may partially penetrate the insulating layers 110 of the package substrate 100 to serve as vias for electrically connecting the wiring patterns.

The first connection pin 300a may be inserted into the first insertion hole 112a to be electrically connected to the portion of the first wiring pattern 120a exposed by the first insertion hole 112a, that is, the first connection pad. The second connection pin 300b may be inserted into the second insertion hole 112b to be electrically connected to the portion of the second wiring pattern 120b exposed by the second insertion hole 112b, that is, the second connection pad. The third connection pin 300c may be inserted into the third insertion hole 112c to be electrically connected to the portion of the third wiring pattern 120c exposed by the third insertion hole 112c, that is, the third connection pad. The fourth connection pin 300d may be inserted into the fourth insertion hole 112d to be electrically connected to the portion of the fourth wiring pattern 120d exposed by the fourth insertion hole 112d, that is, the fourth connection pad.

As illustrated in FIG. 2, the second connection pin 300b may include a connection pillar 30 and a metal bonding layer 32 formed on a surface of the connection pillar 30. The second connection pin 300b may be connected to the portion of the second wiring pattern 120b exposed by the second insertion hole 112b by a thermo-compression process. During the thermo-compression process, the metal bonding layer 32 may be melted at a high temperature while under compression to at least partially fill a space between a surface of the second connection pillar 30 and an inner surface of the second insertion hole 112b. In this way, the second wiring pattern 120b may be electrically connected to the second wiring pattern 120b. It is noted that the second connection pin 300b is illustrated in FIG. 2 by way of example. A similar description applies for the remaining connection pins 300 but a repeated description thereof is omitted for conciseness.

As illustrated in FIG. 3, the chip pads 230 of the semiconductor chip 200 may be arranged in an array form in a pad region R, and the connection pins 300 may be provided on the chip pads 230, respectively, in the pad region R. In some example embodiments, dummy connection pillars may also be provided on the semiconductor chip 200. For example, in some example embodiments, dummy connection pillars 310 may be provided in four corner regions of the semiconductor chip 200 respectively. The dummy connection pillars 310 may be provided respectively on dummy pads provided on the first surface 212 of the semiconductor chip 200.

Each of the dummy connection pillars 310 may have a height less than the height H1 of the first connection pin 300a. Each of the dummy connection pillars 300 may have a diameter greater than the diameter of the connection pin 300. The dummy connection pillars 310 may be disposed between the first surface 212 of the semiconductor chip 200 and the upper surface 102 of the package substrate 100. When the semiconductor chip 200 is mounted via the connection pins 300, the dummy connection pillars 310 may support the semiconductor chip 200 such that the semiconductor chip 200 is stably attached on the package substrate 100.

In example embodiments, the molding member 400 may be formed on the package substrate 100 to protect the semiconductor chip 200 from the outside. The molding member may include an epoxy mold compound (EMC).

Outer connection pads for providing an electrical signal, that is, portions of the fourth wiring pattern 120d exposed by the fifth insulating layer 110e, may be provided on the lower surface 104 of the package substrate 100. The external connection members 500 may be disposed on the outer connection pads of the package substrate 100 for electrical connection with an external device. For example, the external connection member 500 may be a solder ball. The semiconductor package 10 may be mounted on a module substrate (not illustrated) via the solder balls to constitute a memory module.

As mentioned above, the semiconductor package 10 may include the package substrate 100 having the insertion holes extending from the upper surface 102 in the thickness direction toward the lower surface 104 and exposing portions of the wiring patterns in different layers respectively; the semiconductor chip 200 arranged on the package substrate 100 such that the first surface 212 on which the chip pads 230 are formed faces the upper surface 102 of the package substrate 100; and the plurality of connection pins 300 provided on the chip pads 230 and extending through the insertion holes 112 to be electrically connected to the exposed portions of the wiring patterns, respectively.

Accordingly, the semiconductor chip 200 may be mounted on the package substrate 100 by the connection pins 300 that are inserted into the insertion holes 112 formed in the package substrate 100 without using connection members such as bumps.

Thus, since the connection pins 300 are inserted into the insertion holes 112, the overall package thickness may be reduced. Further, since the chip pads 230 of the semiconductor chip 200 are directly connected to the internal wirings of the package substrate 100 by the connection pins 300, a routing space may be reduced and electrical characteristics may be improved.

Hereinafter, a method of manufacturing the semiconductor package in FIG. 1 will be explained.

FIGS. 4 to 18 are cross-sectional views illustrating a method of manufacturing a semiconductor package in accordance with example embodiments. FIGS. 5 to 10 are enlarged cross-sectional views illustrating a portion 'B' in FIG. 4. FIG. 17 is an enlarged cross-sectional view illustrating a portion 'C' in FIG. 16.

Referring to FIGS. 4 to 14, a plurality of connection pins 300 may be formed on chip pads 230 of a semiconductor chip, respectively.

First, the connection pins 300 may be formed on the chip pads 230 of a wafer W including the semiconductor chip in a wafer level.

Figure 4:
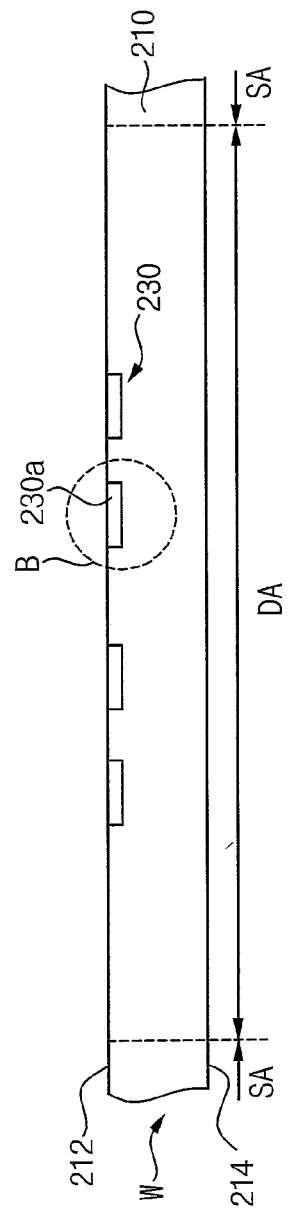
FIGS. 4 to 18 are cross-sectional views illustrating a method of manufacturing a semiconductor package in accordance with example embodiments.

In example embodiments, as illustrated in FIG. 4, the wafer W may include a substrate 210 and the chip pads 230 provided in a first surface 212 of the substrate 210. Although it is not illustrated in the figures, the wafer W may include an insulation interlayer on an active surface of the substrate 210. For example, the chip pad 230 may be provided in an outermost insulation layer of the insulation interlayer. The substrate 210 may include a die region DA where circuit patterns and cells are formed and a scribe lane region SA surrounding the die region DA. As described later, the substrate 210 of the wafer W may be sawed along the scribe lane region SA dividing a plurality of the die regions DA.

For example, the substrate 210 may include may include silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

Circuit patterns (not illustrated) may be provided in the active surface of the substrate 210. The circuit patterns may include a transistor, a diode, etc. The circuit patterns may constitute circuit elements. The chip pad 230 may be electrically connected to the circuit elements by wirings in the insulation interlayer.

In example embodiments, first connection pins 330a may be formed on first chip pads 230a of the plurality of chip pads 230.

Figure 5:
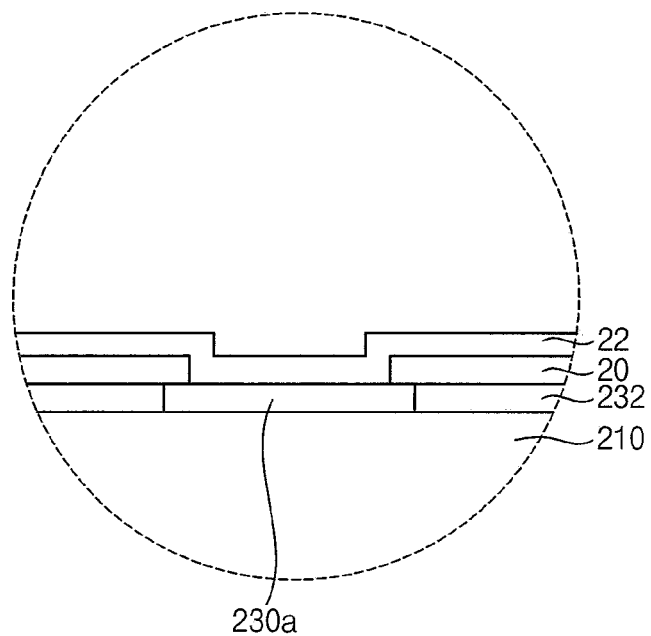

First, as illustrated in FIG. 5, an insulation layer pattern 20 may be formed on a front side 212 of the wafer W (hereinafter, referred to as the first surface of the substrate 210 for simplicity of explanation) to expose the plurality of chip pads, and then, a seed layer 22 may be formed on the chip pads.

For example, the insulation layer pattern 20 may include oxide, or nitride, etc., or a mixture thereof. The insulation layer pattern 20 may be formed by a chemical vapor deposition (CVD) process, a plasma enhanced chemical vapor deposition (PECVD) process, an atomic layer deposition (ALD) process, a lower pressure chemical vapor deposition (LPCVD) process, a sputtering process, etc.

Alternatively, the insulation layer pattern 20 may include a polymer layer formed by a spin coating process or a spray process. In case that a protective layer pattern for exposing the chip pads 230 is formed on the first surface 212 of the substrate 210, the process of forming the insulation layer pattern may be omitted.

The seed layer 22 may include an alloy layer including titanium/copper (Ti/Cu), titanium/palladium (Ti/Pd), titanium/nickel (Ti/Ni), chrome/copper (Cr/Cu) or a combination thereof. The seed layer 22 may be formed by a sputtering process.

Figure 6:
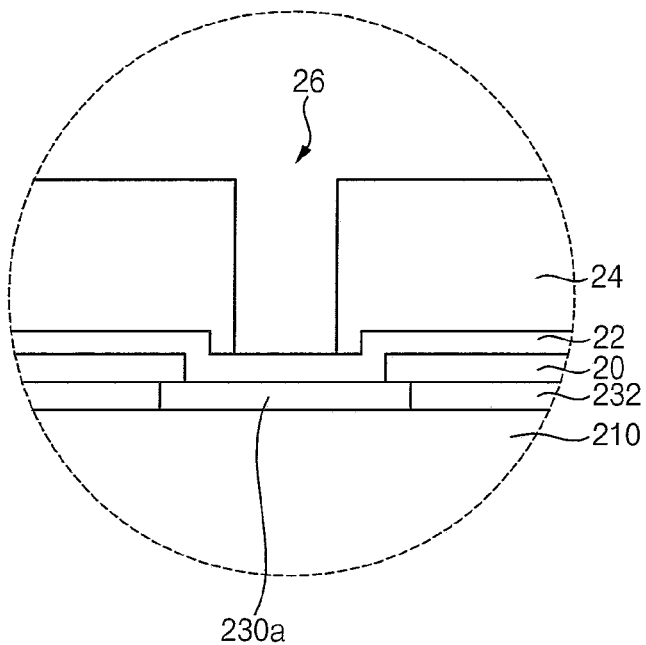

Then, as illustrated in FIG. 6, a photoresist pattern 24 having a first opening 26 which exposes a portion of the seed layer 22 over the first chip pad 230a of the plurality of chip pads may be formed on the first surface 212 of the substrate 210.

After a photoresist layer is formed on the first surface of the substrate 210 to cover the chip pads, an exposure process may be performed on the photoresist layer to form the photoresist pattern 24 having the first opening 26 exposing the portion of the seed layer 22 on the first chip pad 230a of the plurality of chip pads. A first height of a first connection pin to be formed in a later step may depend on a thickness of the photoresist pattern 24. A diameter of the first connection pin may be determined by a diameter of the first opening 26.

Figure 7:
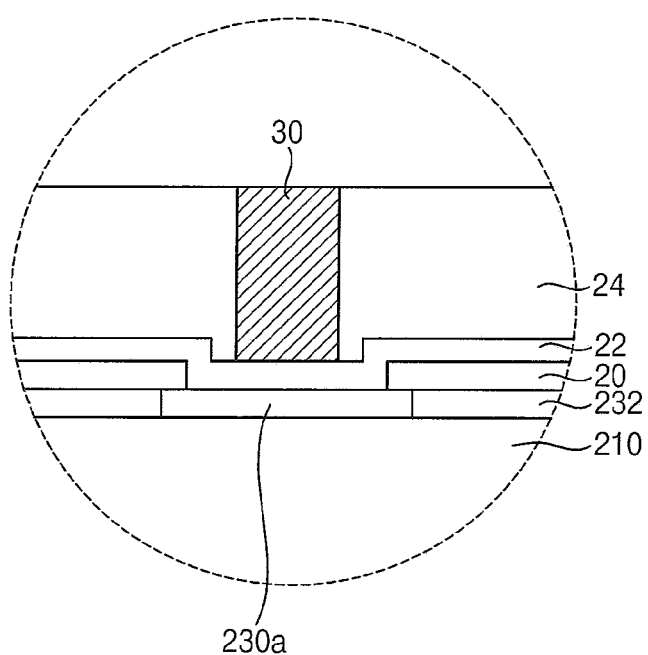

As illustrated in FIG. 7, a conductive material may be formed to fill the first opening 26 of the photoresist pattern 24 to form a connection pillar 30 as the first connection pin. The conductive material may include nickel (Ni), copper (Cu), palladium (Pd), or platinum (Pt), etc.

Figure 8:
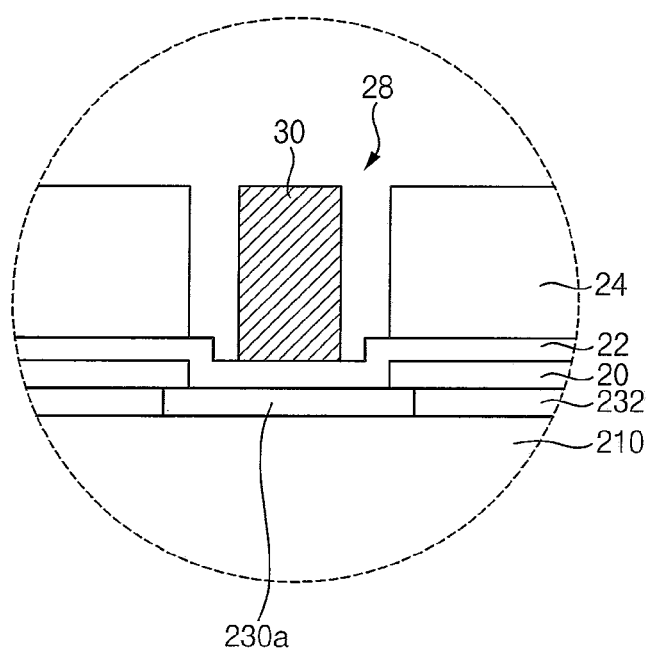
Figure 9:
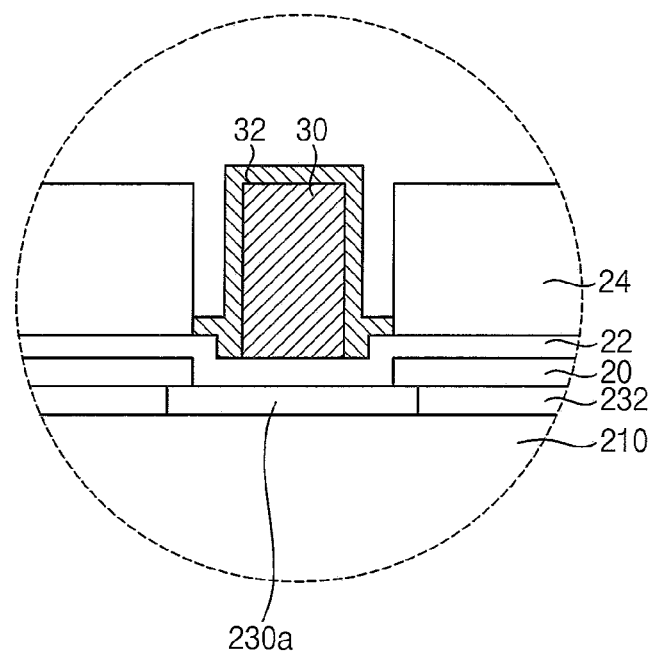

As illustrated in FIGS. 8 and 9, a metal bonding layer 32 may be formed on the connection pillar 30. As shown in FIG. 8, an exposure process may be performed on the photoresist pattern 24 to form a second opening 28 that exposes the connection pillar 30. An outer surface of the connection pillar 30 may be completely exposed by the second opening 28. Then, as shown in FIG. 9, a plating process may be performed to form the metal bonding layer 32 on the surface of the connection pillar 30 and the surface of the seed layer 22 exposed by the second opening 28. The metal bonding layer may include a metal material that has a lower melting point than the metal material of the connection pillar and is in a solid state at room temperature. For example, the metal bonding layer may include a solder material.

Alternatively, the metal bonding layer may be provided in the insertion holes 112. That is, the process of forming the metal bonding layer on the connection pillar may be omitted. In this case, a process of forming a metal bonding layer to fill the insertion holes may be performed. For example, after a metal material of the metal bonding layer is formed to fill insertion holes formed in a package substrate, the connection pins may be inserted into the insertion holes and may be joined with the connection pins at a high temperature under compression such that the semiconductor chip is mounted on the package substrate.

Figure 10:
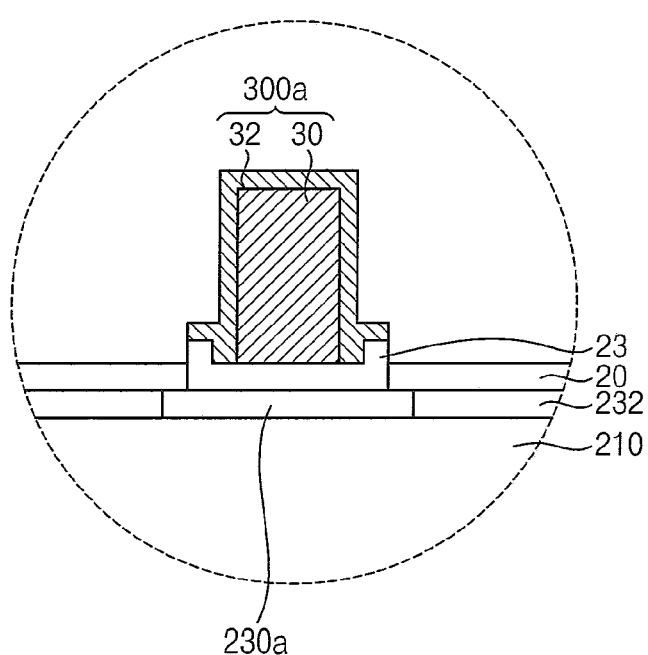
Figure 11:
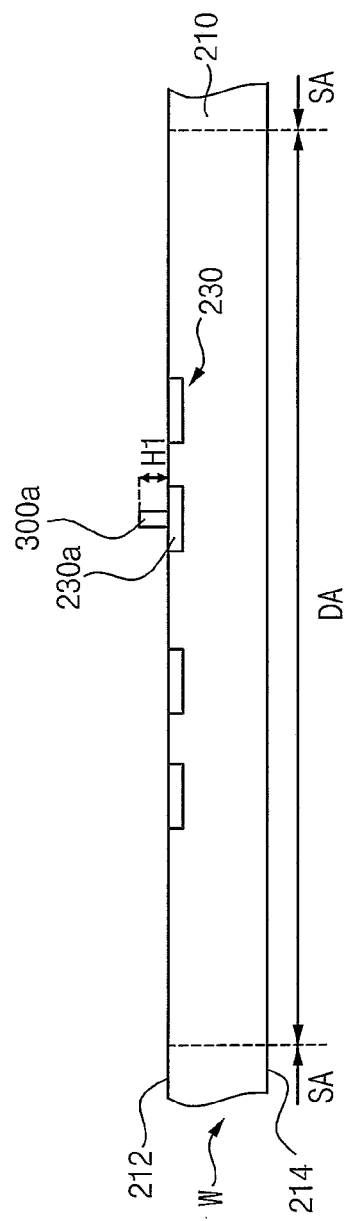

As illustrated in FIG. 10, after the photoresist pattern 24 is removed, the exposed portion of the seed layer 22 may be partially etched using the metal bonding layer 32 as a mask to form a seed layer pattern 23. Thus, as shown in FIG. 11, a first connection pin 300a having a first height H1 may be formed on the first chip pad 230a of the plurality of chip pads. The first connection pin 300a may include the connection pillar 30 formed on the first chip pad 230a and the metal bonding layer 32 formed on the surface of the connection pillar 30. The first connection pin 300a may have a diameter within a range of about 5 µm to about 95 µm.

Figure 12:
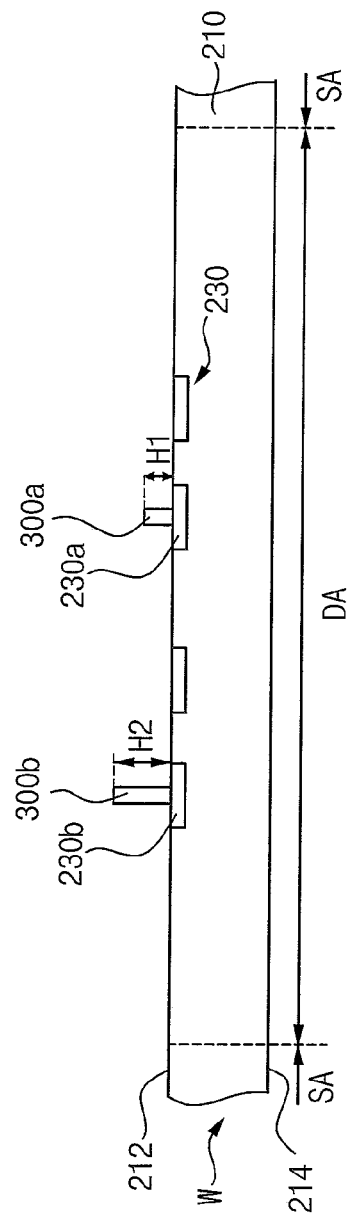

Referring to FIG. 12, a second connection pin 300b having a second height H2 may be formed on a second chip pad 230b of the plurality of chip pads 230.

Processes the same as or similar to the processes described with reference to FIGS. 5 to 10 may be performed to form the second connection pin 300b having the second height H2 on the second chip pad 230b. The second height H2 may be greater than the first height H1.

Figure 13:
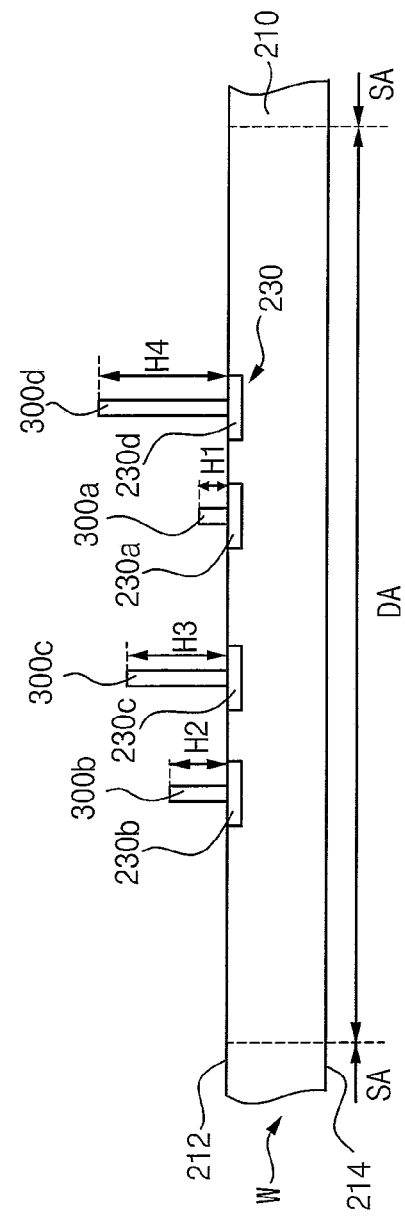

Referring to FIG. 13, a third connection pin 300c having a third height H3 and a fourth connection pin 300d having a fourth height H4 may be formed on a third chip pad 230c and a fourth chip pad 230d of the plurality of chip pads 230, respectively.

Processes the same as or similar to the processes described with reference to FIGS. 5 to 10 may be performed to from the third connection pin 300c having the third height H3 on the third chip pad 230c. The third height H3 may be greater than the second height H2.

Processes the same as or similar to the processes described with reference to FIGS. 5 to 10 may be performed to from the fourth connection pin 300d having the fourth height H4 on the fourth chip pad 230d. The fourth height H4 may be greater than the third height H3.

For example, each of the first to fourth heights H1 to H4 may be within a range of about 15 µm to about 300 µm. A difference between the respective heights, for example, a difference between the second height and the first height may be within a range of about 15 µm to about 180 µm.

Accordingly, the connection pins 300 having different heights may be formed on the plurality of chip pads 230, respectively. The first to fourth connection pins 300a, 300b, 300d and 300d having different heights H1, H2, H3, and H4 may be formed on the first to fourth chip pads 300a, 300b, 300c and 300d, respectively. Each of the first to fourth connection pins 300a, 300b, 300c and 300d may have a diameter within a range of about 5 µm to about 95 µm.

In example embodiments, before or after forming the first to fourth connection pins 300a, 300b, 300c and 300d, dummy connection pillars 310 (see FIG. 16) may be formed in four corner regions of the semiconductor chip 200. Each of the dummy connection pillars may have a diameter greater than the diameter of the connection pin 300. Each of the dummy connection pillars 310 may have a height less than the height H1 of the first connection pin 300a. The dummy connection pillars 310 may support the semiconductor chip 200 such that the semiconductor chip 200 is stably attached onto the package substrate 100 through the connection pins 300 in a subsequent mounting process.

Figure 14:
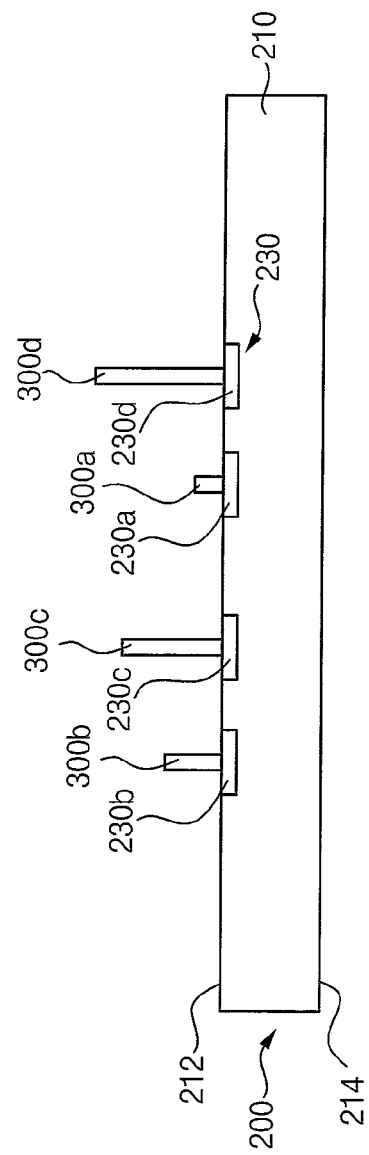

Referring to FIG. 14, the wafer W may be sawed along the scribe lane region SA to form an individual semiconductor chip 200.

Before performing the sawing process, a second surface 214 of the substrate 210 may be grinded.

Figure 15:
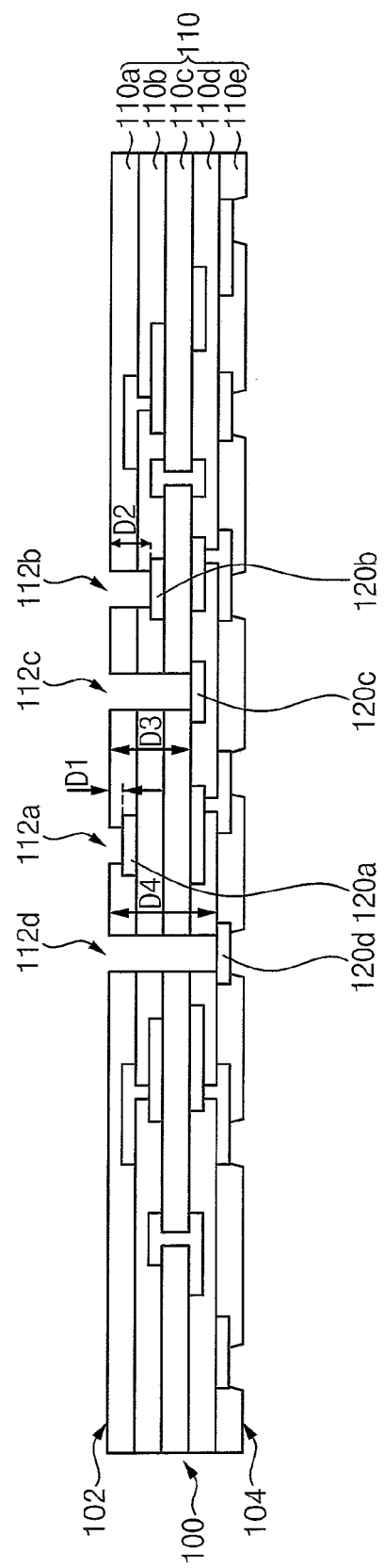

Referring to FIG. 15, a package substrate 100 having insertion holes 112a, 112b, 112c and 112d with different depths may be provided.

In example embodiments, the package substrate 100 may be a multilayer circuit board having an upper surface 102 and a lower surface 104 facing each other. For example, the package substrate 100 may be a printed circuit board (PCB) including wirings respectively provided in a plurality of layers and vias connected to the wirings.

As illustrated in FIG. 15, the package substrate 100 may include a plurality of stacked insulation layers 110 and wiring patterns 120a, 120b, 120c, 120d and 120d provided respectively in the insulation layers.

In particular, first to fifth insulation layers 110a, 110b, 110c, 110d and 110e may be sequentially stacked on one another. The first insulation layer 110a may be an upper cover insulation layer, the second insulation layer 110b may be an upper insulation layer, the third insulation layer 110c may be a core layer, the fourth insulation layer 110d may be a lower insulation layer, and the fifth insulation layer 110e may be a lower cover insulation layer.

For example, the insulation layer may include an insulating material having a thermosetting resin such as epoxy resin or a thermoplastic resin such as polyimide. The insulation layer may include a resin impregnated in a core material such as organic fiber (glass fiber), for example, a prepreg, FR-4, or BT (Bismaleimide Triazine), etc.

A first wiring pattern 120a may be formed on an upper surface of the second insulation layer 110b, and a second wiring pattern 120b may be formed on an upper surface of the third insulation layer 110c. A third wiring pattern 120c may be formed on a lower surface of the third insulation layer 110c, and a fourth wiring pattern 120d may be formed on a lower surface of the fourth insulation layer 110d. For example, the wiring pattern may include a metal material such as copper, or aluminum, etc. It will be understood that arrangements and numbers of the insulation layers and the wiring patterns are exemplary, and are not limited thereto.

The plurality of insertion holes 112a, 112b, 112c and 112d having different depths and extending from the upper surface 102 may be formed in the insulating layer 110 of the package substrate 100. The insertion holes may be formed by an etching process or a laser drilling process.

The first insertion hole 112a may be formed to extend through the first insulation layer 110a from the upper surface 102 in a thickness direction. The first insertion hole 112a may expose a portion of the first wiring pattern 120a. The first insertion hole 112a may have a first depth D1 from the upper surface 102 to expose a portion of a first circuit layer. The portion of the first wiring pattern 120a exposed by the first insertion hole 112a may serve as a first connection pad to which the first connection pin 300a is connected by a subsequent mounting process.

The second insertion hole 112b may be formed to extend through the first and second insulation layers 110a and 110b from the upper surface 102 in the thickness direction. The second insertion hole 112b may expose a portion of the second wiring pattern 120b. The second insertion hole 112b may have a second depth D2 from the upper surface 102 greater than the first depth D1 to expose a portion of a second circuit layer. The portion of the second wiring pattern 120b exposed by the second insertion hole 112b may serve as a second connection pad to which the second connection pin 300b is connected by a subsequent mounting process.

The third insertion hole 112c may be formed to extend through the first, second and third insulation layers 110a, 110b and 110c from the upper surface 102 in the thickness direction. The third insertion hole 112c may expose a portion of the third wiring pattern 120c. The third insertion hole 112c may have a third depth D3 from the upper surface 102 greater than the second depth D2 to expose a portion of a third circuit layer. The portion of the third wiring pattern 120c exposed by the third insertion hole 112c may serve as a third connection pad to which the third connection pin 300c is connected by a subsequent mounting process.

The fourth insertion hole 112d may be formed to extend through the first, second, third and fourth insulation layers 110a, 110b, 110c and 110d from the upper surface 102 in the thickness direction. The fourth insertion hole 112d may expose a portion of the fourth wiring pattern 120d. The fourth insertion hole 112d may have a fourth depth D4 from the upper surface 102 greater than the third depth D3 to expose a portion of a fourth circuit layer. The portion of the fourth wiring pattern 120d exposed by the fourth insertion hole 112d may serve as a fourth connection pad to which the fourth connection pin 300d is connected by a subsequent mounting process.

Figure 16:
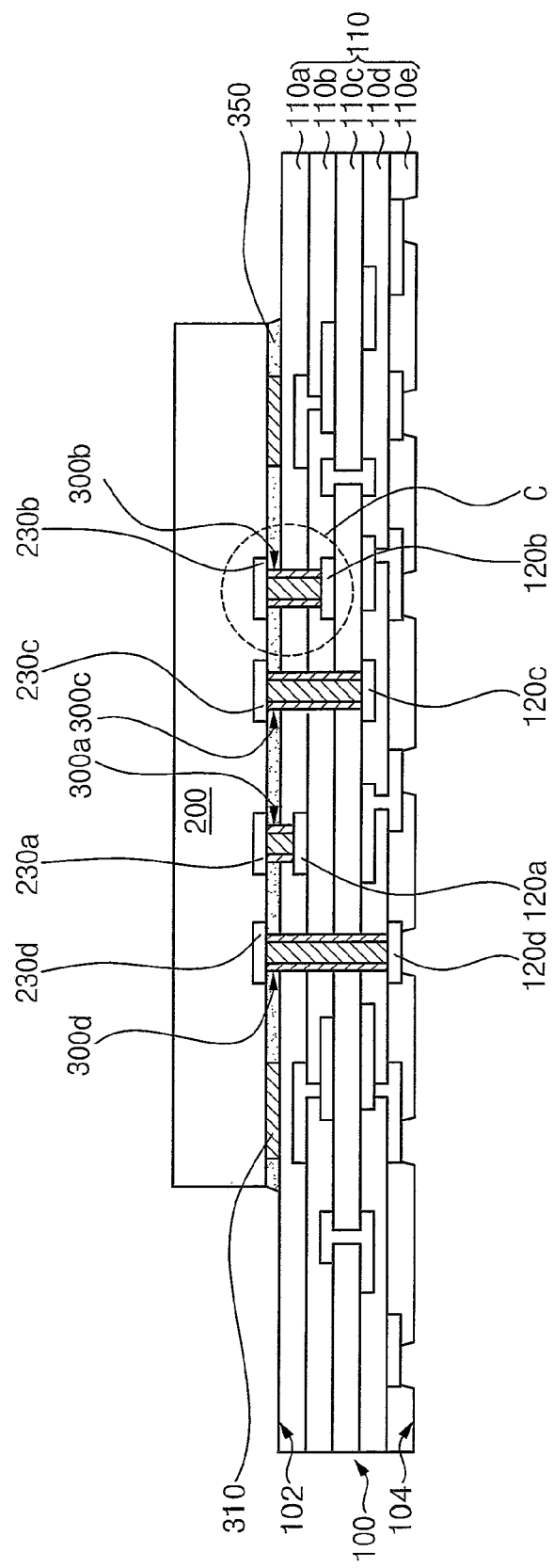
Figure 17:
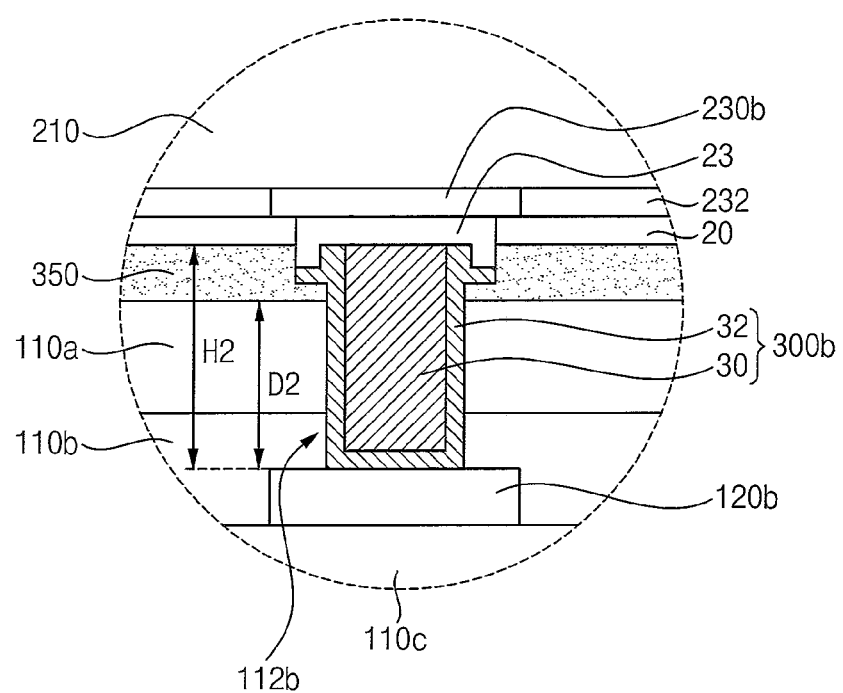

Referring to FIGS. 16 and 17, the semiconductor chip 200 may be mounted on the package substrate 100.

In example embodiments, the semiconductor chip 200 may be mounted on the package substrate 100 in a flip chip bonding manner. In this case, the semiconductor chip 200 may be mounted on the package substrate 100 such that the active surface on which the chip pads 230 are formed, that is, the first surface 212 faces the package substrate 100. In some example embodiments, an underfill member 350 may be provided between the first surface 212 of the semiconductor chip 200 and the upper surface 102 of the package substrate 100.

When the semiconductor chip 200 is disposed on the package substrate 100, the connection pins 300 on the chip pads 230 may be inserted into the insertion holes formed in the package substrate 100, and may be bonded to the portions of the wiring patterns exposed by the insertion holes by a thermo-compression process.

The first connection pin 300a may be inserted into the first insertion hole 112a to be electrically connected to the portion of the first wiring pattern 120a exposed by the first insertion hole 112a, that is, the first connection pad. The first connection pin 300a may physically contact the first connection pad. The second connection pin 300b may be inserted into the second insertion hole 112b to be electrically connected to the portion of the second wiring pattern 120b exposed by the second insertion hole 112b, that is, the second connection pad. The second connection pin 300b may physically contact the second connection pad. The third connection pin 300c may be inserted into the third insertion hole 112c to be electrically connected to the portion of the third wiring pattern 120c exposed by the third insertion hole 112c, that is, the third connection pad. The third connection pin 300c may physically contact the third connection pad. The fourth connection pin 300d may be inserted into the fourth insertion hole 112d to be electrically connected to the portion of the fourth wiring pattern 120d exposed by the fourth insertion hole 112d, that is, the fourth connection pad. The fourth connection pin 300d may physically contact the fourth connection pad.

As illustrated in FIG. 17, the second connection pin 300b may include the connection pillar 30 and the metal bonding layer 32 formed on a surface of the connection pillar 30. The second connection pin 300b may be connected to the portion of the second wiring pattern 120b exposed by the second insertion hole 112b by a thermo-compression process. In the thermos-compression process, the metal bonding layer 32 may be melted at a high temperature to at least partially fill a space between a surface of the second connection pillar 30 and an inner surface of the second insertion hole 112b.

Alternatively, the metal bonding layer 32 may be formed to fill in the insertion holes 112. In this case, after a metal material of the metal bonding layer is filled in the insertion holes formed in the package substrate 100, the connection pins 300 may be inserted into the insertion holes, and the connection pins 300 may be bonded to portions of the wiring patterns at a high temperature while under compression.

Alternatively, the connection pins 300 may be directly bonded to the portions of the wiring patterns by, for example, Cu—Cu bonding.

Figure 18:
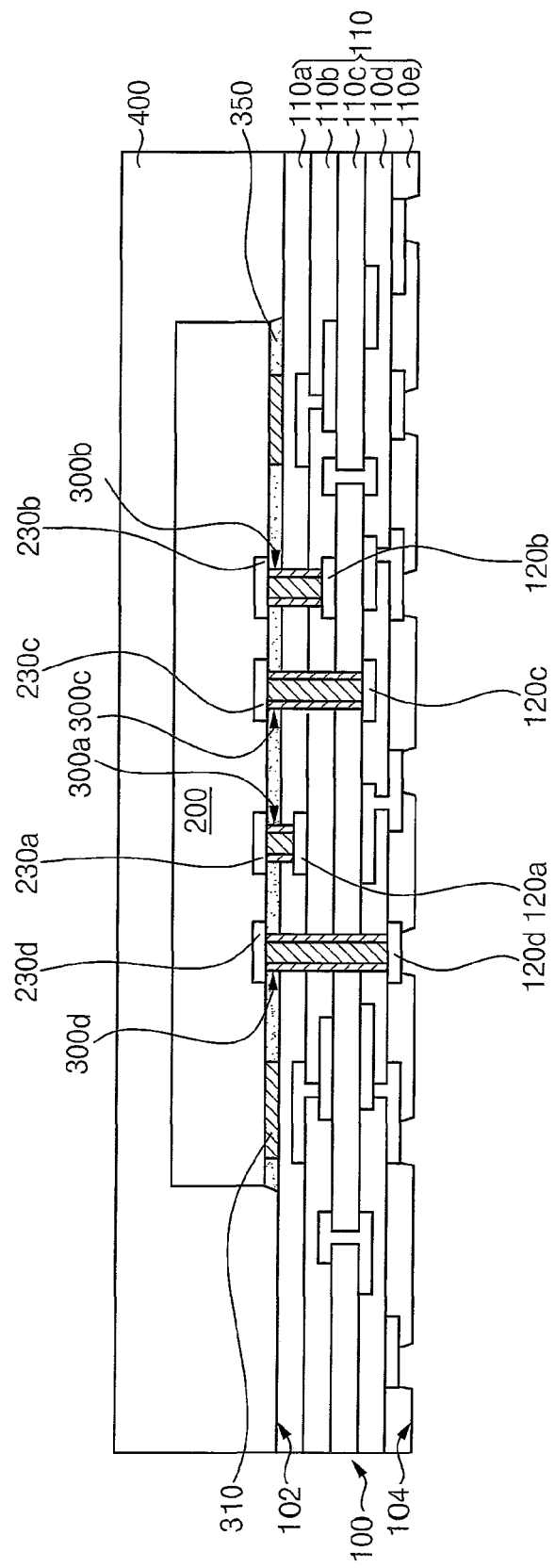

Referring to FIG. 18, a molding member 400 may be formed on the package substrate 100 to cover the semiconductor chip 200. For example, the molding member 400 may include an insulating material such as an epoxy molding compound.

Then, in some example embodiments, external connection members such as solder balls may be disposed on outer connection pads on the lower surface 104 of the package substrate 100, that is, portions of the fourth wiring pattern 120d exposed by the fifth insulation layer 110e, as illustrated in FIG. 1.

Figure 19:
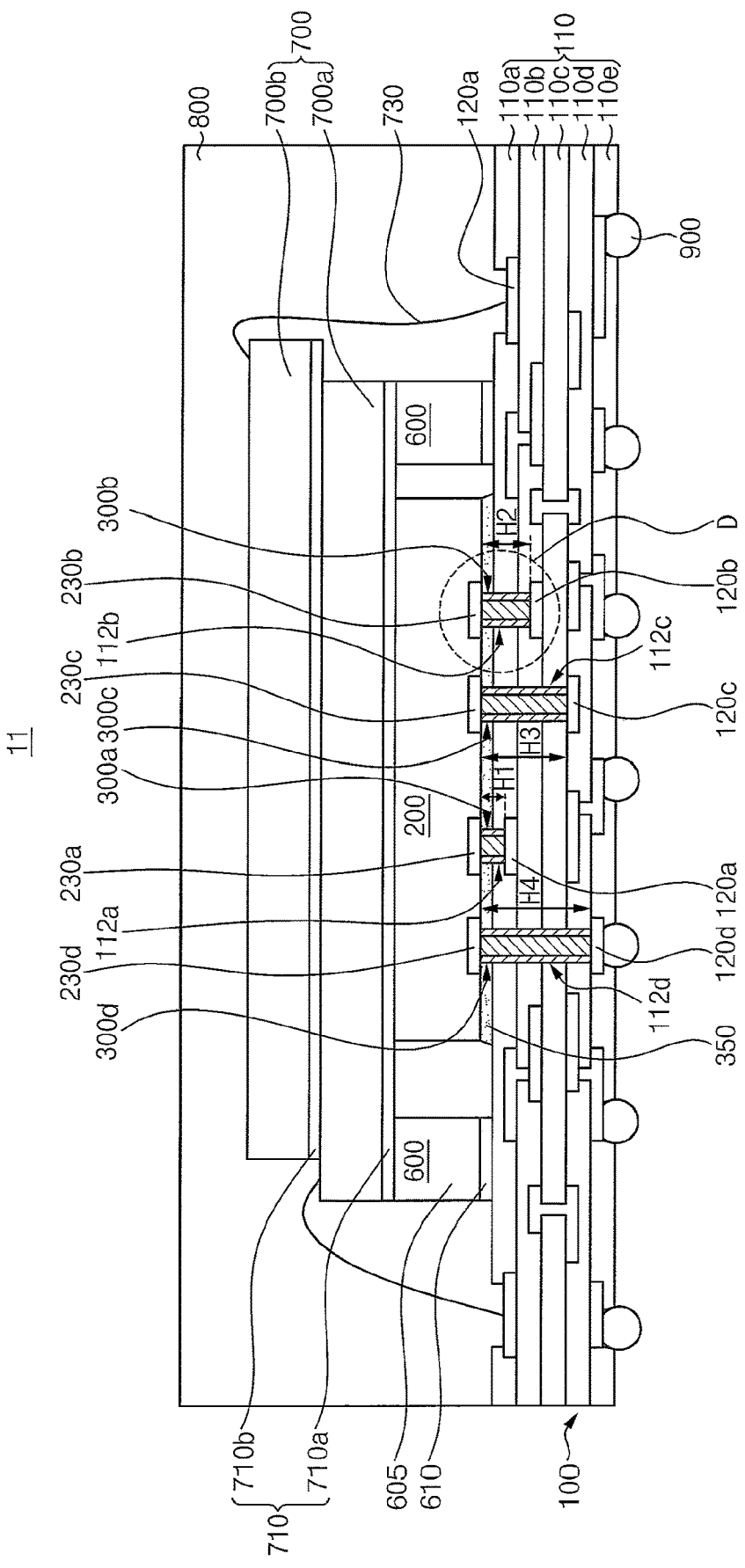
FIG. 19 is a cross-sectional view illustrating a semiconductor package in accordance with example embodiments.
Figure 20:
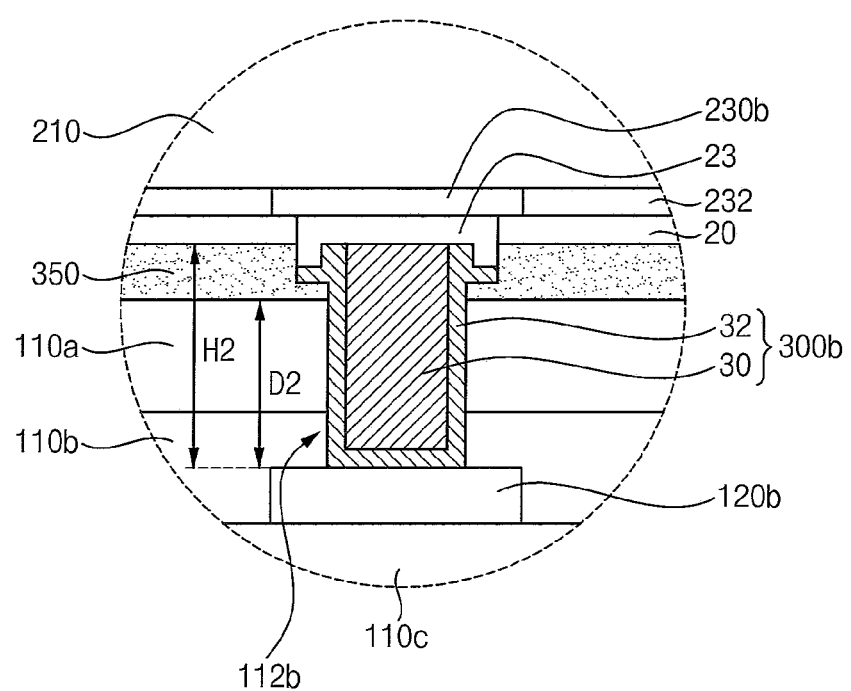
FIG. 20 is an enlarged cross-sectional view illustrating a portion 'D' of the semiconductor package of FIG. 19.

FIG. 19 is a cross-sectional view illustrating a semiconductor package in accordance with example embodiments. FIG. 20 is an enlarged cross-sectional view illustrating a portion 'D' of the semiconductor package of FIG. 19. The semiconductor package may be substantially the same as or similar to the semiconductor package described with reference to FIGS. 1 to 3 except for an additional support structure and second semiconductor chips. Thus, same reference numerals will be used to refer to the same or like elements and any further repetitive explanation concerning the above elements will be omitted for conciseness.

Referring to FIGS. 19 and 20, a semiconductor package 11 may include a package substrate 100, a first semiconductor chip 200, a plurality of connection pins 300, a support structure 600, a plurality of additional semiconductor chips 700 and a molding member 800. Additionally, in some example embodiments, the semiconductor package 11 may further include conductive connection members 730 for electrically connecting the additional semiconductor chips 700 to the package substrate 100. Further, in some example embodiments, the semiconductor package 11 may further include external connection members 900.

In example embodiments, the package substrate 100 may be a multilayer circuit board having an upper surface 102 and a lower surface 104 facing each other. For example, the package substrate 100 may be a printed circuit board (PCB) including wirings respectively provided in a plurality of layers and vias connected to the wirings.

The package substrate 100 may include a first wiring pattern 120a, a second wiring pattern 120b, a third wiring pattern 120c, and a fourth wiring pattern 120d stacked sequentially on one another.

The package substrate 100 may include a plurality of insertion holes 112 having different depths and extending from the upper surface 102. For example, the insertion holes 112 may have a diameter within a range of about 15 µm to about 150 µm. The insertion holes 112 may extend from the upper surface 102 toward the lower surface 104.

The plurality of insertion holes 112 may include a first insertion hole 112a, a second insertion hole 112b, a third insertion hole 112c, and a fourth insertion hole 112d. The first insertion hole 112a may extend through a first insulation layer 110a from the upper surface 102 in a thickness direction to a portion of the first wiring pattern 120a. The first insertion hole 112a may have a first depth D1 from the upper surface 102 to expose a portion of a first circuit layer. The portion of the first wiring pattern 120a exposed by the first insertion hole 112a may serve as a first connection pad to which a first connection pin 300a is connected.

The second insertion hole 112b may be formed to extend through the first and second insulation layers 110a and 110b from the upper surface 102 in the thickness direction to expose a portion of the second wiring pattern 120b. The second insertion hole 112b may have a second depth D2 from the upper surface 102 greater than the first depth D1 to expose a portion of a second circuit layer. The portion of the second wiring pattern 120b exposed by the second insertion hole 112b may serve as a second connection pad to which a second connection pin 300b is connected.

The third insertion hole 112c may be formed to extend through the first, second and third insulation layers 110a, 110b and 110c from the upper surface 102 in the thickness direction to expose a portion of the third wiring pattern 120c. The third insertion hole 112c may have a third depth D3 from the upper surface 102 greater than the second depth D2 to expose a portion of a third circuit layer. The portion of the third wiring pattern 120c exposed by the third insertion hole 112c may serve as a third connection pad to which a third connection pin 300c is connected.

The fourth insertion hole 112d may be formed to extend through the first, second, third and fourth insulation layers 110a, 110b, 110c and 110d from the upper surface 102 in the thickness direction to expose a portion of the fourth wiring pattern 120d. The fourth insertion hole 112d may have a fourth depth D4 from the upper surface 102 greater than the third depth D3 to expose a portion of a fourth circuit layer. The portion of the fourth wiring pattern 120d exposed by the fourth insertion hole 112d may serve as a fourth connection pad to which the fourth connection pin 300d is connected.

The first semiconductor chip 200 may be disposed on the package substrate 100. The first semiconductor chip 200 may be mounted on the package substrate 100 through the connection pins 300. The first semiconductor chip 200 may be a logic chip including a logic circuit. The logic chip may be a controller that controls memory chips.

The first semiconductor chip 200 may include a plurality of chip pads 230 provided on a first surface 212 thereof. The connection pins 300 having different heights may be provided on the plurality of chip pads 230.

A first connection pin 300a having a first height H1 may be formed on a first chip pad 230a of the plurality of chip pads. A second connection pin 300b having a second height H2 may be formed on a second chip pad 230b. The second height H2 may be greater than the first height H1. A third connection pin 300c having a third height H3 may be formed on a third chip pad 230c. The third height H3 may be greater than the second height H2. A fourth connection pin 300d having a fourth height H4 may be formed on a fourth chip pad 230d. The fourth height H4 may be greater than the third height H3.

In example embodiments, the first semiconductor chip 200 may be mounted on the package substrate 100 in a flip chip bonding manner. In this case, the first semiconductor chip 200 may be mounted on the package substrate 100 such that an active surface on which the chip pads 230 are formed, that is, the first surface 212 faces the package substrate 100.

When the first semiconductor chip 200 is disposed on the package substrate 100, the connection pins 300 on the chip pads 230 may be inserted into the insertion holes formed in the package substrate 100, and may be bonded to the portions of the wiring patterns exposed by the insertion holes by a thermo-compression process. The connection pins 300 may partially penetrate the insulating layers 110 of the package substrate 100 to serve as vias for electrically connecting the wiring patterns.

The first connection pin 300a may be inserted into the first insertion hole 112a to be electrically connected to the portion of the first wiring pattern 120a exposed by the first insertion hole 112a, that is, the first connection pad. The first connection pin 300a may physically contact the first connection pad. The second connection pin 300b may be inserted into the second insertion hole 112b to be electrically connected to the portion of the second wiring pattern 120b exposed by the second insertion hole 112b, that is, the second connection pad. The second connection pin 300b may physically contact the second connection pad. The third connection pin 300c may be inserted into the third insertion hole 112c to be electrically connected to the portion of the third wiring pattern 120c exposed by the third insertion hole 112c, that is, the third connection pad. The third connection pin 300c may physically contact the third connection pad. The fourth connection pin 300d may be inserted into the fourth insertion hole 112d to be electrically connected to the portion of the fourth wiring pattern 120d exposed by the fourth insertion hole 112d, that is, the fourth connection pad. The fourth connection pin 300d may physically contact the fourth connection pad.

As illustrated in FIG. 20, the second connection pin 300b may include a connection pillar 30 and a metal bonding layer 32 formed on a surface of the connection pillar 30. The second connection pin 300b may be connected to the portion of the second wiring pattern 120b exposed by the second insertion hole 112b by a thermo-compression process. During the thermos-compression process, the metal bonding layer 32 may be melted at a high temperature while under compression to at least partially fill a space between a surface of the second connection pillar 30 and an inner surface of the second insertion hole 112b.

Returning to FIG. 19, in example embodiments, the support structure 600 may be disposed on the upper surface 102 of the package substrate 100 to be spaced apart from the first semiconductor chip 200. The support structure 600 may be attached on the upper surface 102 of the package substrate 100 using an adhesive film 610. The support structure 600 may be disposed between the package substrate 100 and other electronic components to support other electronic components.

The support structure 600 may include a support spacer 605 and an adhesive film 610 attached to a lower surface of the support spacer 605. For example, the adhesive film 610 may include a die adhesive film (DAF). The support spacer 605 may be attached on the upper surface 102 of the package substrate 100 using the adhesive film 610 by a die attach process.

In some example embodiments, the support structure 600 may include a plurality of support structures. For example, two support structures 600 may be disposed on sides of the first semiconductor chip 200. A height of the support structure 600 from the package substrate 100 may be substantially the same as a height of the first semiconductor chip 200.

In example embodiments, a plurality of the additional semiconductor chips 700 may be stacked on the first semiconductor chip 200 and the support structure 600. The plurality of additional semiconductor chips 700 may include a second semiconductor chip 700a and a third semiconductor chip 700b. The second and third semiconductor chips 700a and 700b may be attached on the support structure 600 using adhesive members 710. For example, the second semiconductor chip 700a may be attached to the support structure 600 and the first semiconductor chip 200 using a first adhesive member 710a, and the third semiconductor chip 700b may be attached to the second semiconductor chip 700a using a second adhesive member 710b. For example, the adhesive member 710 may include a die adhesive film (DAF). In some example embodiments, a planar area of one or more of the plurality of additional semiconductor chips 700 may be greater than a planar area of the first semiconductor chip 200. In some example embodiments, a planar area of one or more of the plurality of additional semiconductor chips 700 may be greater than a combined planar area of the first semiconductor chip 200 and the support structure 600. Accordingly, the second and third semiconductor chips 700a and 700b may be supported and mounted by the support structure 600 on the package substrate 100.

The plurality of additional semiconductor chips 700 may be electrically connected to the package substrate 100 by the conductive connection members 730. In particular, the conductive connection member 730 may connect chip pads of the additional semiconductor chips 700 to substrate pads of the package substrate 100, that is, portions of the first wiring pattern 120a exposed by the first insulating layer 110a. For example, the conductive connection member 730 may include a bonding wire. Accordingly, the additional semiconductor chips 700 may be stacked on the support structure 600 and may be electrically connected to the package substrate 100 by a plurality of the conductive connection members 730.

The additional semiconductor chips 700 may include a memory chip including a memory circuit. For example, the additional semiconductor chips 700 may include a nonvolatile memory device such as a NAND flash memory. It will be understood that the number, sizes, arrangement, etc. of the additional semiconductor chips 700 are provided by way of example, and are not limited thereto.

In example embodiments, the molding member 800 may be formed on the package substrate 100 to protect the first semiconductor chip 200, the support structure 600 and the additional semiconductor chips 700 from the environment. The molding member may include an epoxy mold compound (EMC).

Outer connection pads for providing an electrical signal, that is, portions of the fourth wiring 120d exposed by the fifth insulating layer 110e may be provided on the lower surface 104 of the package substrate 100. External connection members 900 for electrical connection with an external device may be disposed on the outer connection pads of the package substrate 100. For example, the external connection member 900 may be a solder ball. The semiconductor package 11 may be mounted on a module substrate (not illustrated) via the solder balls to constitute a memory module.

As mentioned above, the semiconductor package 11 may include the package substrate 100, the first semiconductor chip 200 and the support structure 600 mounted on the package substrate 100, the plurality of additional semiconductor chips 700 supported on the first semiconductor chip 200 and the support structure 600, and the molding member 800 on the package substrate 100 covering the first semiconductor chip 200, the support structure 600 and the additional semiconductor chips 700.

The first semiconductor chip 200 may be mounted on the package substrate 100 through the connection pins 300. When the semiconductor chip 200 is mounted on the package substrate 100, the connection pins 300 on the chip pads 230 may be inserted into the insertion holes formed in the package substrate 100, and may be bonded to the portions of the wiring patterns exposed by the insertion holes by a thermo-compression process. Accordingly, the connection pins 300 may partially penetrate the insulating layers 110 of the package substrate 100 to serve as vias for electrically connecting the wiring patterns.

Accordingly, it may be possible to reduce the overall package thickness and improve structural stability. Thus, the molding member may be prevented from getting through a space between the first semiconductor chip 200 and the package substrate 100, and may be prevented from getting through a space between the first semiconductor chip 200 and the additional semiconductor chips 700 due to tilting of the first semiconductor chip 200 mounted by the flip-chip bonding manner.

Hereinafter, a method of manufacturing the semiconductor package in FIG. 19 will be explained.

FIGS. 21 to 26 are cross-sectional views illustrating a method of manufacturing a semiconductor package in accordance with example embodiments.

Figure 21:
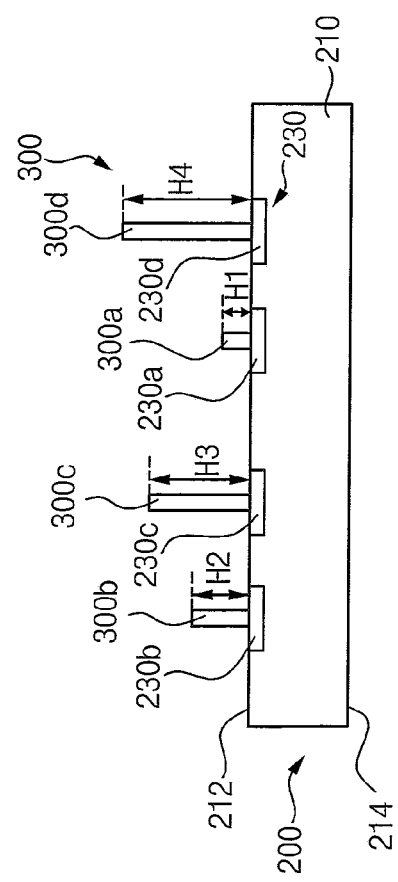
FIGS. 21 to 26 are cross-sectional views illustrating a method of manufacturing a semiconductor package in accordance with example embodiments.

Referring to FIG. 21, a plurality of connection pins 300 may be formed on chip pads 230 of a first semiconductor chip 200, respectively.

Processes the same as or similar to the processes described with reference to FIGS. 4 to 14 may be performed to form the connection pins 300 having different heights on the chip pads 230.

A first connection pin 300a having a first height H1 may be formed on a first chip pad 230a of the plurality of chip pads. A second connection pin 300b having a second height H2 may be formed on a second chip pad 230b. The second height H2 may be greater than the first height H1. A third connection pin 300c having a third height H3 may be formed on a third chip pad 230c. The third height H3 may be greater than the second height H2. A fourth connection pin 300d having a fourth height H4 may be formed on a fourth chip pad 230d. The fourth height H4 may be greater than the third height H3. For example, the first to fourth heights may be within a range of 15 nm to 300 nm. A difference between the respective heights, for example, a difference between the second height and the first height may be within a range of about 15 nm to about 180 nm.

Figure 22:
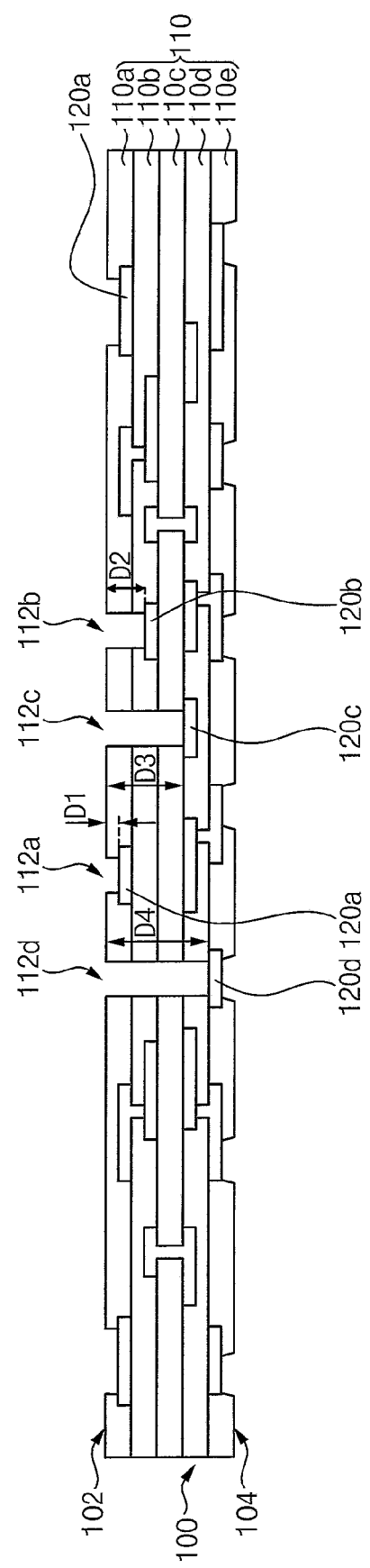

Referring to FIG. 22, insertion holes 112a, 112b, 112c and 112d having different depths may be formed in a package substrate 100.

For example, the insertion holes may be formed by an etching process or a laser drilling process.

A first insertion hole 112a may be formed to extend through a first insulation layer 110a from an upper surface 102 in a thickness direction. The first insertion hole 112a may expose a portion of a first wiring pattern 120a. The first insertion hole 112a may have a first depth D1 from the upper surface 102 to expose a portion of a first circuit layer. The portion of the first wiring pattern 120a exposed by the first insertion hole 112a may serve as a first connection pad to which the first connection pin 300a is connected by a subsequent mounting process.

A second insertion hole 112b may be formed to extend through the first and second insulation layers 110a and 110b from the upper surface 102 in the thickness direction. The second insertion hole 112b may expose a portion of the second wiring pattern 120b. The second insertion hole 112b may have a second depth D2 from the upper surface 102 greater than the first depth D1 to expose a portion of a second circuit layer. The portion of the second wiring pattern 120b exposed by the second insertion hole 112b may serve as a second connection pad to which the second connection pin 300b is connected by a subsequent mounting process.

A third insertion hole 112c may be formed to extend through the first, second and third insulation layers 110a, 110b and 110c from the upper surface 102 in the thickness direction. The third insertion hole 112c may expose a portion of the third wiring pattern 120c. The third insertion hole 112c may have a third depth D3 from the upper surface 102 greater than the second depth D2 to expose a portion of a third circuit layer. The portion of the third wiring pattern 120c exposed by the third insertion hole 112c may serve as a third connection pad to which the third connection pin 300c is connected by a subsequent mounting process.

A fourth insertion hole 112d may be formed to extend through the first, second, third and fourth insulation layers 110a, 110b, 110c and 110d from the upper surface 102 in the thickness direction. The fourth insertion hole 112d may expose a portion of the fourth wiring pattern 120d. The fourth insertion hole 112d may have a fourth depth D4 from the upper surface 102 greater than the third depth D3 to expose a portion of a fourth circuit layer. The portion of the fourth wiring pattern 120d exposed by the fourth insertion hole 112d may serve as a fourth connection pad to which the fourth connection pin 300d is connected by a subsequent mounting process.

Figure 23:
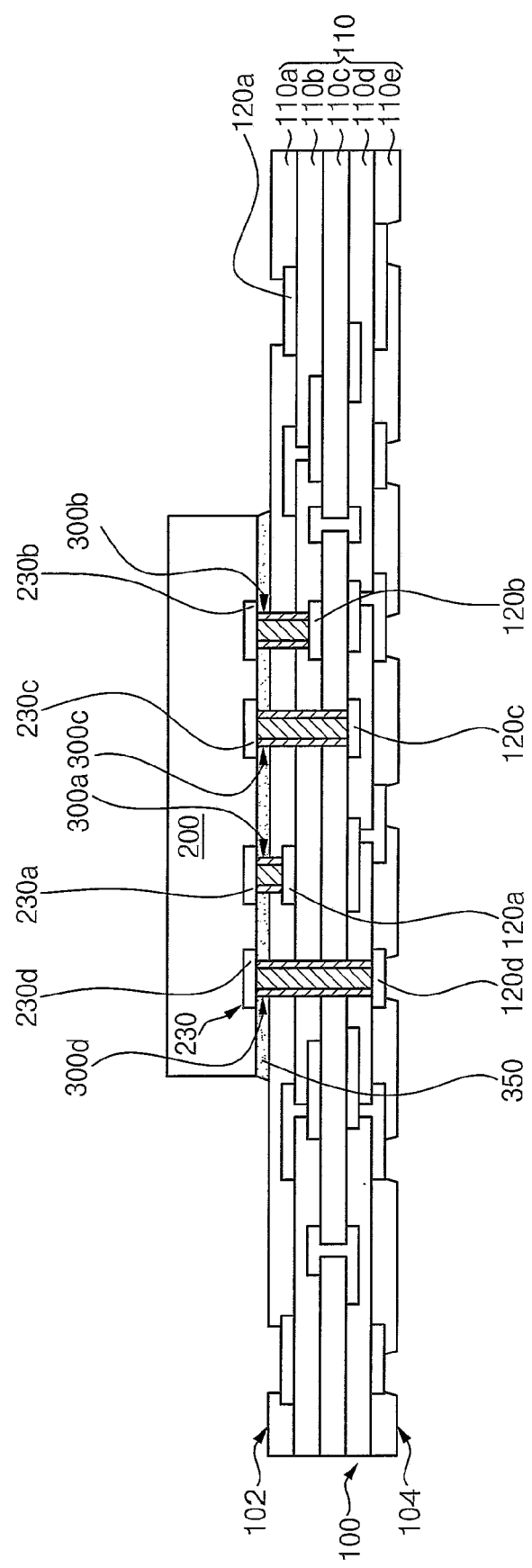

Referring to FIG. 23, the first semiconductor chip 200 may be mounted on the package substrate 100.

In example embodiments, the first semiconductor chip 200 may be mounted on the package substrate 100 in a flip chip bonding manner. In this case, the first semiconductor chip 200 may be mounted on the package substrate 100 such that an active surface on which the chip pads 230 are formed, that is, a first surface 212 faces the package substrate 100.

When the first semiconductor chip 200 is disposed on the package substrate 100, the connection pins 300 on the chip pads 230 may be inserted into the insertion holes formed in the package substrate 100, and may be bonded to the portions of the wiring patterns exposed by the insertion holes by a thermo-compression process.

The first connection pin 300a may be inserted into the first insertion hole 112a to be electrically connected to the portion of the first wiring pattern 120a exposed by the first insertion hole 112a, that is, the first connection pad. The first connection pin 300a may physically contact the first connection pad. The second connection pin 300b may be inserted into the second insertion hole 112b to be electrically connected to the portion of the second wiring pattern 120b exposed by the second insertion hole 112b, that is, the second connection pad. The second connection pin 300b may physically contact the second connection pad. The third connection pin 300c may be inserted into the third insertion hole 112c to be electrically connected to the portion of the third wiring pattern 120c exposed by the third insertion hole 112c, that is, the third connection pad. The third connection pin 300c may physically contact the third connection pad. The fourth connection pin 300d may be inserted into the fourth insertion hole 112d to be electrically connected to the portion of the fourth wiring pattern 120d exposed by the fourth insertion hole 112d, that is, the fourth connection pad. The fourth connection pin 300d may physically contact the fourth connection pad.

Figure 24:
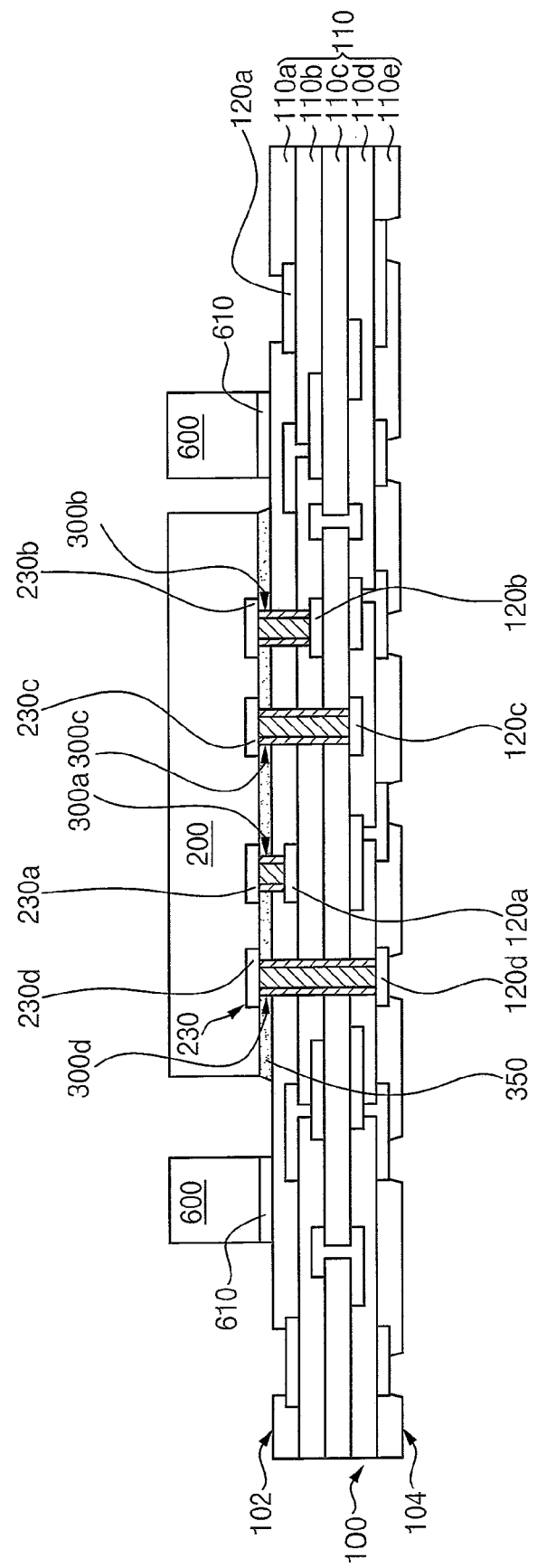

Referring to FIG. 24, at least one support structure 600 may be stacked on the package substrate 100.

In example embodiments, the support structure 600 may be attached on the upper surface 102 of the package substrate 100 using an adhesive film 610 to be spaced apart from the first semiconductor chip 200. Two support structures 600 may be disposed in both sides of the first semiconductor chip 200. For example, the adhesive film 610 may include a die adhesive film (DAF). The support structure 600 may be attached on the upper surface 102 of the package substrate 100 using the adhesive film 610 by a die attach process.

A height of the support structure 600 from the package substrate 100 may be substantially the same as a height of the first semiconductor chip 200. In some example embodiments, the height of the support structure may be greater than the height of the first semiconductor chip 200.

Figure 25:
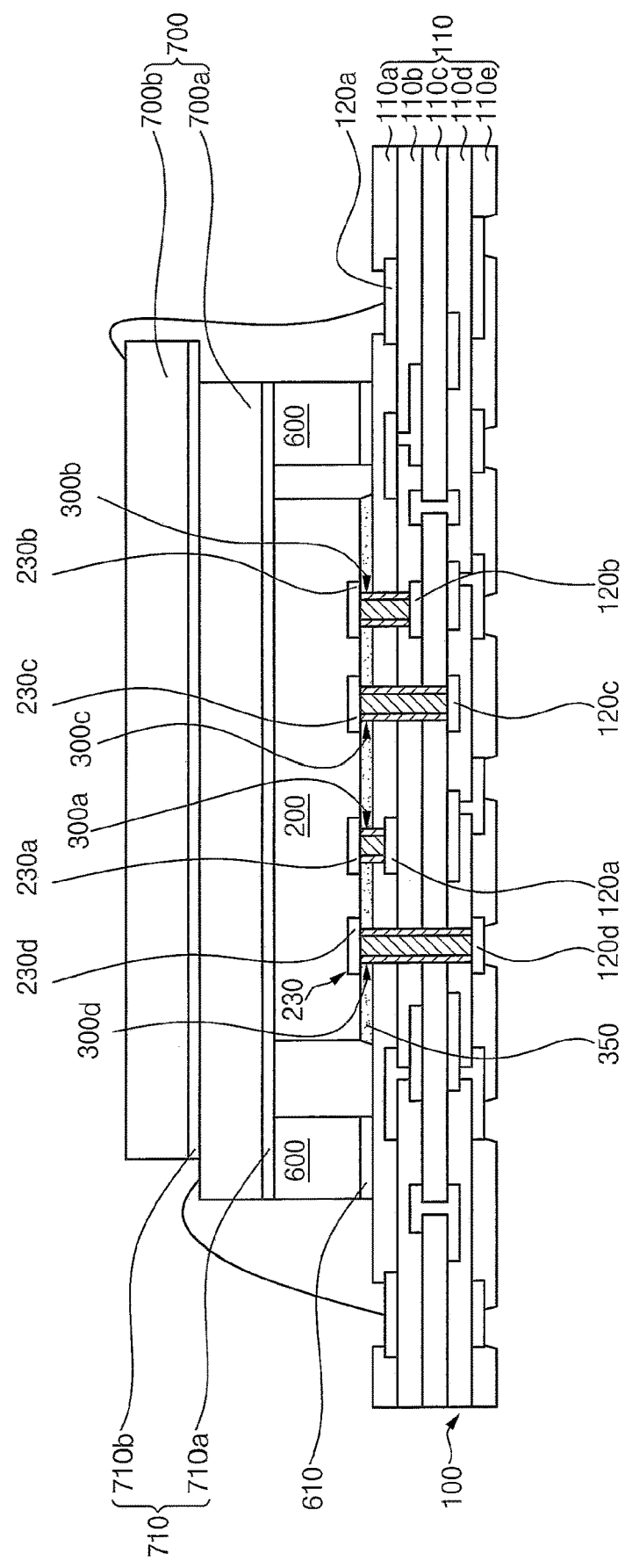

Referring to FIG. 25, a plurality of additional semiconductor chips 700 may be stacked on the first semiconductor chip 200 and the support structure 600.

In some example embodiments, the additional semiconductor chips 700 may include a second semiconductor chip 700a and a third semiconductor chip 700b. The second and third semiconductor chips 700a and 700b may be attached on the support structure 600 using adhesive members 710. For example, the second semiconductor chip 700a may be attached to the support structure 600 and the first semiconductor chip 200 using a first adhesive member 710a, and the third semiconductor chip 700b may be attached to the second semiconductor chip 700a using a second adhesive member 710b. A planar area of one or more of the additional semiconductor chips 700 may be greater than a planar area of the first semiconductor chip 200. In some example embodiments, a planar area of one or more of the additional semiconductor chips 700 may be greater than a combined planar area of the first semiconductor chip 200 and the support structure 600. Accordingly, the second and third semiconductor chips 700a and 700b may be supported and mounted by the support structure 600 on the package substrate 100.

The additional semiconductor chips 700 may be offset-aligned sequentially or in a zigzag manner. For example, the second and third semiconductor chips 700a and 700b may be stacked in a cascade structure. The second and third semiconductor chips 700a and 700b may be sequentially offset-aligned in a first lateral direction (right direction) of the package substrate 100. The second and third semiconductor chips 700a and 700b may be attached on the first semiconductor chip 200 and the support structure 300 using an adhesive film 710 such as DAF.

Then, a wire bonding process may be performed to connect chip pads of the second and third semiconductor chips 700a and 700b to substrate pads on the upper surface 102 of the package substrate 100, that is, portions of the first wiring pattern 120a exposed by the first insulating layer 110a. The chip pads of the second and third semiconductor chips 700a and 700b may be connected to the substrate pads by conductive connecting members 730, that is, bonding wires.

Figure 26:
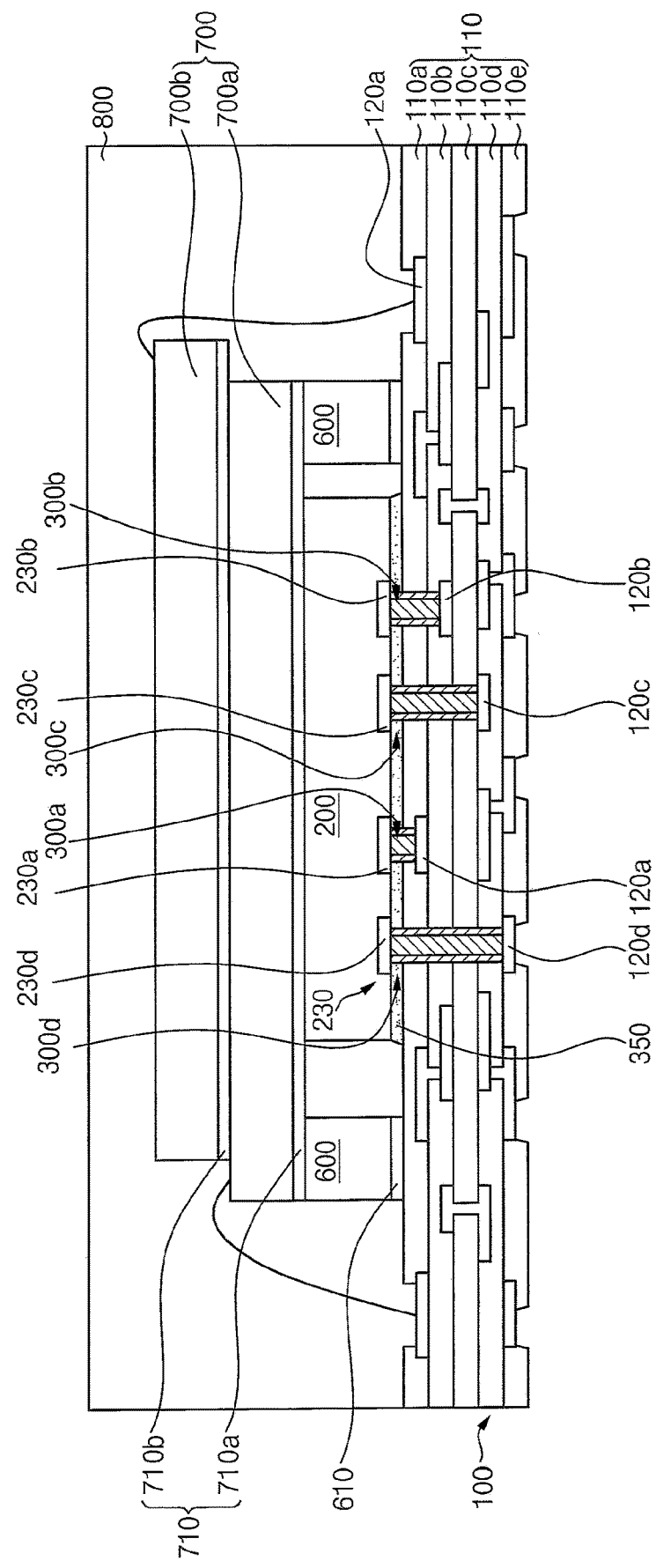

Referring to FIG. 26, a molding member 800 may be formed on the upper surface 102 of the package substrate 100 to cover the first semiconductor chip 200, the support structure 600 and the additional semiconductor chips 700. The molding member may include an epoxy mold compound (EMC).

Then, external connection members such as solder balls may be formed on outer connection pads on a lower surface 104 of the package substrate 100, that is, portions of the fourth wiring pattern 120d exposed by the fifth insulating layer 110e as illustrated in FIG. 19.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or nonvolatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages described above. Accordingly, all such modifications are intended to be included within the scope of example embodiments as defined in the claims.

What is claimed is:

1. A semiconductor package comprising:
a package substrate including wiring patterns provided respectively in a plurality of insulation layers, the package substrate having insertion holes extending from an upper surface of the package substrate in a thickness direction of the package substrate to expose portions of the wiring patterns in different insulation layers;
a semiconductor chip disposed on the package substrate, the semiconductor chip having a first surface on which chip pads are formed;
a plurality of connection pins provided on the chip pads, respectively, the plurality of connection pins extending through corresponding ones of the insertion holes and electrically connecting to the portions of the wiring patterns, respectively, that are exposed by the insertion holes; and
a molding member provided on the package substrate to cover the semiconductor chip,
wherein heights of the plurality of connection pins from the first surface of the semiconductor chip are greater than depths of the corresponding ones of the insertion holes from the upper surface of the package substrate such that the plurality of connection pins physically contact the portions of the wiring patterns that are exposed by the corresponding ones of the insertion holes,
wherein each of the plurality of connection pins includes a connection pillar provided on the respective chip pad and extending from the first surface of the semiconductor chip and a metal bonding layer provided to cover an entire outer surface of the connection pillar, and
wherein the metal bonding layers of the plurality of connection pins physically contact and form a thermocompression bond with the portions of the wiring patterns, respectively, that are exposed by the insertion holes.

2. The semiconductor package of claim 1, wherein the wiring patterns include a first wiring pattern, a second wiring pattern, and a third wiring pattern stacked sequentially on one another, and
wherein the insertion holes include a first insertion hole exposing a portion of the first wiring pattern, a second insertion hole exposing a portion of the second wiring pattern and a third insertion hole exposing a portion of the third wiring pattern.

3. The semiconductor package of claim 2, wherein the plurality of connection pins includes:
a first connection pin in the first insertion hole and electrically connected to the portion of the first wiring pattern that is exposed by the first insertion hole;
a second connection pin in the second insertion hole and electrically connected to the portion of the second wiring pattern that is exposed by the second insertion hole; and
a third connection pin in the third insertion hole and electrically connected to the portion of the third wiring pattern that is exposed by the third insertion hole.

4. The semiconductor package of claim 3, wherein the first connection pin has a first height from the first surface of the semiconductor chip, the second connection pin has a second height from the first surface of the semiconductor chip, and the third connection pin has a third height from the first surface of the semiconductor chip,
the second height is greater than the first height, and
the third height is greater than the second height.

5. The semiconductor package of claim 1, wherein the metal bonding layer at least partially fills a space between the surface of the connection pillar and an inner surface of a corresponding insertion hole.

6. The semiconductor package of claim 1, wherein the metal bonding layer includes a metal material,
the metal material has a lower melting point than a melting point of the connection pillar, and
the metal material is in a solid state at room temperature.

7. The semiconductor package of claim 1, wherein each of the insertion holes has a first diameter within a range of about 15 µm to about 150 µm, and each of the plurality of connection pins has a second diameter within a range of about 5 µm to about 95 µm, the first diameter being greater than the second diameter.

8. The semiconductor package of claim 1, wherein a height of each of the plurality of connection pins from the first surface of the semiconductor chip is within a range of about 15 µm to about 300 µm.

9. The semiconductor package of claim 1, further comprising:
dummy connection pillars provided in corner regions, respectively, of the first surface of the semiconductor chip, the dummy connection pillars contacting the upper surface of the package substrate.

10. A semiconductor package comprising:
a package substrate including a first wiring pattern, a second wiring pattern, and a third wiring pattern sequentially stacked from an upper surface of the package substrate, the package substrate having a first insertion hole, a second insertion hole, and a third insertion hole extending from the upper surface of the package substrate into the package substrate to expose portions of the first wiring pattern, the second wiring pattern, and the third wiring pattern in different insulation layers, respectively;
a semiconductor chip disposed on the package substrate and having a first surface on which chip pads are formed;
a plurality of connection pins provided on the chip pads, respectively, the plurality of connection pins including a first connection pin, a second connection pin, and a third connection pin extending through the first insertion hole, the second insertion hole, and the third insertion hole to electrically connect to the portions of the first wiring pattern, the second wiring pattern, and the third wiring pattern that are exposed by the first insertion hole, the second insertion hole, and the third insertion hole, respectively; and
a molding member provided on the package substrate to cover the semiconductor chip,
wherein each of the first insertion hole, the second insertion hole, and the third insertion hole has a first diameter within a range of about 15 µm to about 150 µm, and each of the first connection pin, the second connection pin and the third connection pin has a second diameter within a range of about 5 µm to about 95 µm, the first diameter being greater than the second diameter, wherein a first height of the first connection pin from the first surface of the semiconductor chip is greater than a first depth of the first insertion hole from the upper surface of the package substrate, such that the first connection pin physically contacts the portion of the first wiring pattern, a second height of the second connection pin from the first surface of the semiconductor chip is greater than a second depth of the second insertion hole from the upper surface of the package substrate, such that the second connection pin physically contacts the portion of the second wiring pattern, and a third height of the third connection pin from the first surface of the semiconductor chip is greater than a third depth of the third insertion hole from the upper surface of the package substrate, such that the third connection pin physically contacts the portion of the third wiring pattern, wherein each of the first connection pin, the second connection pin and the third connection pin includes a connection pillar provided on the respective chip pad and extending from the first surface of the semiconductor chip and a metal bonding layer provided to cover an entire outer surface of the connection pillar, and wherein the metal bonding layers of the plurality of connection pins physically contact and form a thermocompression bond with the portions of the wiring patterns, respectively, that are exposed by the insertion holes.

11. The semiconductor package of claim 10, wherein the second height is greater than the first height, and
the third height is greater than the second height.

12. The semiconductor package of claim 10, wherein the metal bonding layer at least partially fills a space between the surface of the connection pillar and an inner surface of a corresponding insertion hole.

13. The semiconductor package of claim 10, wherein the metal bonding layer includes a metal material,
the metal material has a lower melting point than a melting point of the connection pillar, and
the metal material is in a solid state at room temperature.

14. A semiconductor package comprising:
a package substrate;
a first semiconductor chip disposed on the package substrate, the first semiconductor chip having a first surface on which chip pads are formed;
a plurality of connection pins provided on the chip pads of the first semiconductor chip, respectively;
at least one support structure on an upper surface of the package substrate, the at least one support structure being spaced from the first semiconductor chip;
a plurality of additional semiconductor chips stacked on the package substrate and supported by the at least one support structure; and
a molding member provided on the upper surface of the package substrate to cover the first semiconductor chip, the at least one support structure and the plurality of additional semiconductor chips, wherein the package substrate includes wiring patterns provided respectively in a plurality of insulation layers and the package substrate has insertion holes extending from the upper surface of the package substrate into the package substrate to expose portions of the wiring patterns in different insulation layers, respectively, and wherein the plurality of connection pins extend through corresponding ones of the insertion holes to electrically connect to the portions of the wiring patterns, respectively, that are exposed by the insertion holes, and wherein heights of the plurality of connection pins from the first surface of the semiconductor chip are greater than depths of the corresponding ones of the insertion holes from the upper surface of the package substrate such that the plurality of connection pins physically contact the portions of the wiring patterns that are exposed by the corresponding ones of the insertion holes, wherein each of the plurality of connection pins includes a connection pillar provided on the respective chip pad and extending from the first surface of the semiconductor chip and a metal bonding layer provided to cover an entire outer surface of the connection pillar, and wherein the metal bonding layers of the plurality of connection pins physically contact and form a thermocompression bond with the portions of the wiring patterns, respectively, that are exposed by the insertion holes.

15. The semiconductor package of claim 14, wherein each of the insertion holes has a first diameter within a range of about 15 μm to about 150 μm, and each of the plurality of connection pins has a second diameter within a range of about 5 μm to about 95 μm, the first diameter being greater than the second diameter.

16. The semiconductor package of claim 14, wherein the height of each of the plurality of connection pins from the first surface of the first semiconductor chip is within a range of about 15 μm to about 300 μm.

17. The semiconductor package of claim 14, wherein a height of each of the at least one support structure from the package substrate is a same height as a height of the first semiconductor chip.

18. The semiconductor package of claim 14, further comprising:
conductive connection members connecting chip pads of the plurality of additional semiconductor chips to substrate pads of the package substrate respectively.

* * * * *